United States Patent
Chen et al.

(10) Patent No.: US 9,704,572 B2
(45) Date of Patent: Jul. 11, 2017

(54) SENSE AMPLIFIER WITH INTEGRATING CAPACITOR AND METHODS OF OPERATION

(71) Applicant: SanDisk Technologies LLC, Plano, TX (US)

(72) Inventors: Yingchang Chen, Cupertino, CA (US); Anurag Nigam, San Jose, CA (US); Chang Siau, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/663,775

(22) Filed: Mar. 20, 2015

(65) Prior Publication Data

US 2016/0276023 A1    Sep. 22, 2016

(51) Int. Cl.
| | | |
|---|---|---|
| *G11C 13/00* | (2006.01) | |
| *G11C 11/16* | (2006.01) | |
| *G11C 16/26* | (2006.01) | |
| *G11C 27/02* | (2006.01) | |

(52) U.S. Cl.
CPC ........ *G11C 13/004* (2013.01); *G11C 11/1673* (2013.01); *G11C 11/1675* (2013.01); *G11C 13/0069* (2013.01); *G11C 16/26* (2013.01); *G11C 27/024* (2013.01); *G11C 2013/0045* (2013.01); *G11C 2013/0054* (2013.01); *G11C 2013/0088* (2013.01); *G11C 2213/71* (2013.01)

(58) Field of Classification Search
CPC .............. G11C 13/004; G11C 13/0069; G11C 11/1673; G11C 11/1675; G11C 16/26; G11C 27/024; G11C 2013/0054; G11C 2013/0045; G11C 2013/0088; G11C 2213/71

USPC .................. 365/72, 149, 205, 206, 207, 208
See application file for complete search history.

(56) References Cited

U.S. PATENT DOCUMENTS

| | | | | | |
|---|---|---|---|---|---|
| 5,341,333 | A | * | 8/1994 | Tien ........................ | G11C 7/062 327/51 |
| 5,469,395 | A | * | 11/1995 | Kuwabara ........... | G11C 11/4074 365/202 |
| 5,528,545 | A | * | 6/1996 | Takahashi .............. | G11C 7/062 327/51 |

(Continued)

OTHER PUBLICATIONS

U.S. Appl. No. 14/663,786, filed Mar. 20, 2015.

(Continued)

*Primary Examiner* — Vu Le
*Assistant Examiner* — Sung Cho
(74) *Attorney, Agent, or Firm* — Vierra Magen Marcus LLP

(57) ABSTRACT

A non-volatile memory is described that includes a sense amplifier that maintains a bit line voltage and output of the sense amplifier at a substantially constant voltage during read operations. During a preset phase, an output of the sense amplifier that is coupled to a selected bit line is grounded. At least one capacitor is precharged during the preset phase. During a sense phase, the sense amplifier output is disconnected from ground while the memory array is biased for reading a selected memory cell. A resulting cell current is integrated by the at least one capacitor. The integrated cell current discharges a sense node from the precharge level to an accurate voltage level based on the resulting cell current.

11 Claims, 21 Drawing Sheets

(56) References Cited

U.S. PATENT DOCUMENTS

| | | | |
|---|---|---|---|
| 5,537,356 A * | 7/1996 | Akaogi | G11C 29/04 327/51 |
| 6,813,209 B2 | 11/2004 | Crain et al. | |
| 6,950,361 B2 | 9/2005 | Kamoshida et al. | |
| 7,167,393 B2 | 1/2007 | Oikawa et al. | |
| 8,050,092 B2 | 11/2011 | Jung et al. | |
| 8,305,815 B2 * | 11/2012 | La Rosa | G11C 7/12 365/185.21 |
| 8,593,876 B2 * | 11/2013 | Moschiano | G11C 16/0483 365/185.21 |
| 8,947,924 B2 * | 2/2015 | Li | G11C 13/0004 365/163 |
| 2003/0048684 A1 * | 3/2003 | Tanzawa | G11O 5/147 365/226 |
| 2003/0103400 A1 * | 6/2003 | Van Tran | G11C 11/5621 365/207 |
| 2006/0072363 A1 * | 4/2006 | Tran | G11C 11/5642 365/207 |
| 2006/0083091 A1 * | 4/2006 | Edahiro | G11C 7/12 365/203 |
| 2006/0231733 A1 * | 10/2006 | Boemler | H04N 5/3592 250/208.1 |
| 2007/0063041 A1 * | 3/2007 | Kamiyama | G06K 7/10237 235/451 |
| 2008/0232177 A1 * | 9/2008 | Choi | G11C 13/00 365/189.15 |
| 2008/0310244 A1 * | 12/2008 | Baker | G11C 7/02 365/207 |
| 2010/0315858 A1 * | 12/2010 | Lynch | G11C 11/404 365/149 |
| 2013/0211757 A1 * | 8/2013 | Miyamoto | G06F 3/0416 702/65 |
| 2014/0125629 A1 * | 5/2014 | Miyamoto | G06F 3/044 345/174 |

OTHER PUBLICATIONS

R. Fackenthal, et al., "A 16Gb ReRAM with 200MB/s Write and 16GB/s Read in 27nm Technology," ISSCC Digest of Technical Papers, Feb. 2014, pp. 338-339.

U.S. Appl. No. 14/539,150, filed Nov. 12, 2014.

* cited by examiner

SENSE AMPLIFIER WITH INTEGRATING CAPACITOR AND METHODS OF OPERATION

BACKGROUND OF THE INVENTION

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

DETAILED DESCRIPTION

The disclosed technology is directed to non-volatile memory including a sense amplifier that maintains a bit line voltage and output of the sense amplifier at a substantially constant voltage during read operations. During a preset phase, an output of the sense amplifier that is coupled to a selected bit line is grounded. At least one capacitor is precharged during the preset phase. During a sense phase, the sense amplifier output is disconnected from ground while the memory array is biased for reading a selected memory cell. A resulting cell current is integrated by the at least one capacitor. The integrated cell current discharges a sense node from the precharge level to accurately provide a voltage based on the resulting cell current.

In one example, the at least one capacitor includes an integrating capacitor and a second capacitor, both of which are coupled to the sense amplifier output. During the present phase, the integrating capacitor is precharged to a first voltage and the second capacitor is precharged to a second voltage. The second plate of the integrating capacitor is coupled to a sense node which is also precharged to the first voltage. The second plate of the second capacitor is coupled to a first transistor and a second transistor. The first and second transistors are formed in series with a second terminal of the second transistor coupled to the sense node and a first terminal of the first transistor coupled to ground. The first terminal of the second capacitor and the second terminal of the first capacitor are connected. The level of the second voltage is set by the threshold voltage of the first transistor. During the sense phase, the first capacitor and the second capacitor are disconnected from their precharge sources. The voltage at the second plate of the second capacitor is held at the second voltage through a feedback loop created by the transistors, capacitors, and a current source. In this manner, the first plate of the second capacitor and the sense amplifier output are held at 0V.

In one embodiment, a reverse read operation is performed by connecting a selected bit line to zero volts and a selected word line to a read voltage. The unselected word lines and unselected word lines are held at zero volts. Using these bias conditions enables a quick precharge and allows a low or zero bit line settling time to be used. Lengthy times to precharge the bit lines to a high voltage level for sensing and negative voltage sources can be avoided. A single state transistor circuit can be used while avoiding offset voltages and large footprints that may be used by some systems. Coupling the second capacitor to the first and second transistors allows accurate sensing without the use of accurate voltage sources or current sources. A stable voltage at the second capacitor and sense amplifier output can be maintained without using an accurate source current or voltage.

Figure 1:
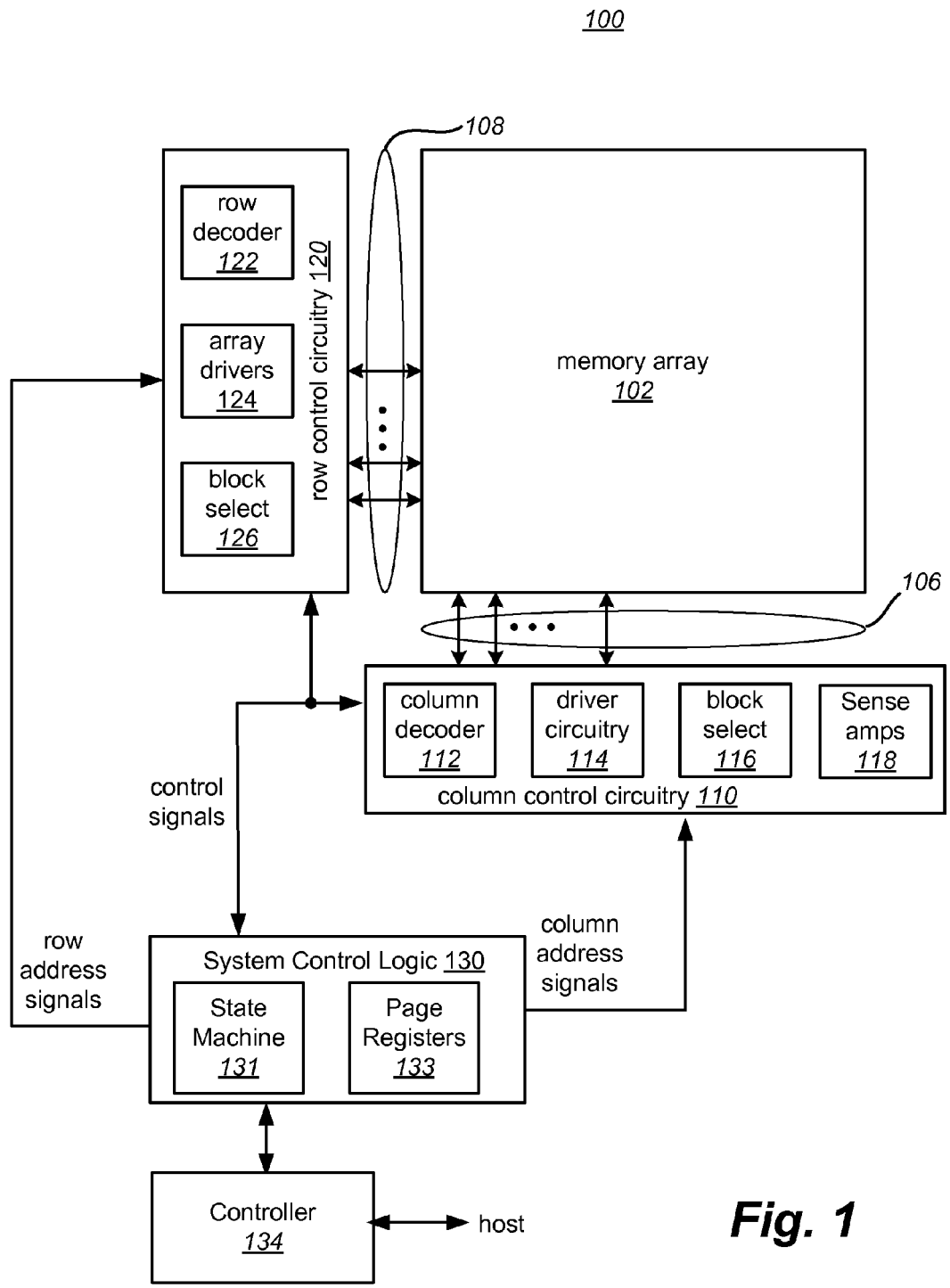
FIG. 1 is a block diagram of one embodiment of a non-volatile memory system.

FIG. 1 is a block diagram that depicts one example of a memory system 100 that can be used to implement embodiments of the disclosed technology. Memory system 100 includes a memory array 102, which can be a two or three-dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133 and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be considered control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer.

In another embodiment, memory cells are re-writable. For example, a rewriteable non-volatile memory cell can include a diode or other select device coupled in series or another fashion with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
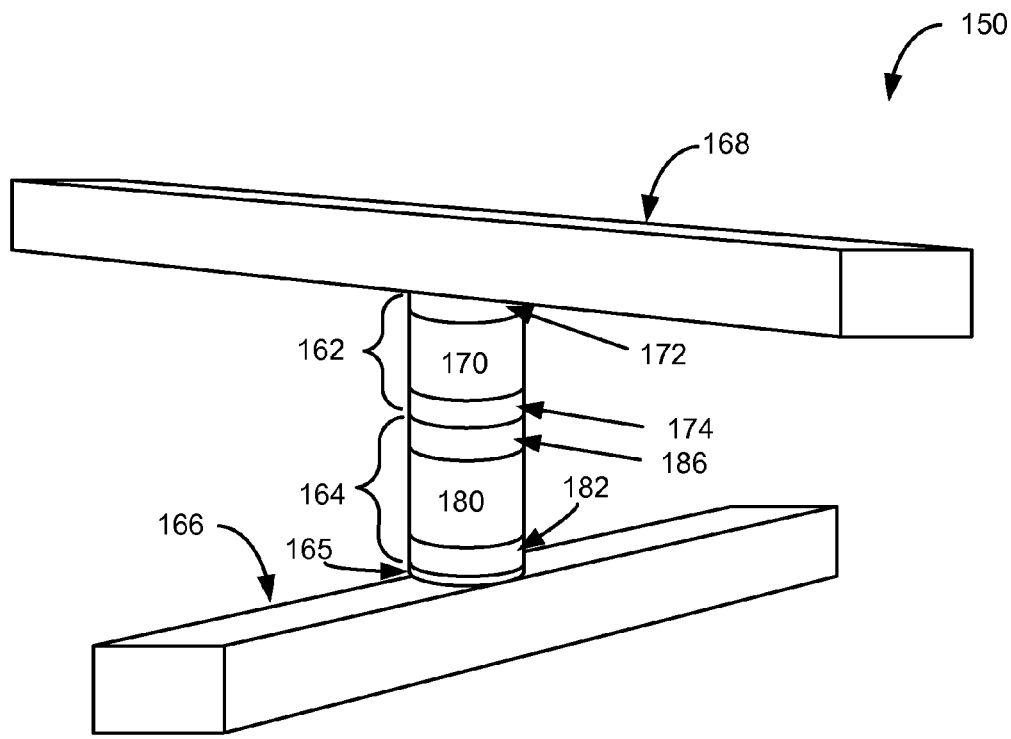
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168. Reversible resistance-switching element 162 includes reversible resistance-switching material 170 having a resistance that may be reversibly switched between two or more states. In some embodiments, reversible resistance-switching material 170 may be formed from a metal oxide.

Various different metal oxides can be used. In one example, nickel oxide is used. In one embodiment, the reversible resistance-switching material 170 includes at least a portion of a nickel oxide layer formed by selectively depositing nickel and then oxidizing the nickel layer. In other embodiments, nickel oxide itself may be selectively deposited. In other embodiments Hafnium oxide may be deposited by an atomic layer deposition process using a precursor containing Hafnium. Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described in Rose et al., U.S. Pat. No. 5,541,869. Another class of material is taught by Ignatiev et al. in U.S. Pat. No. 6,473,332: these are perovskite materials such as $Pr_{1-X}Ca_XMnO_3$ (PCMO), $La_{1-X}Ca_XMnO_3$ (LCMO), $LaSrMnO_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_XB_Y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164. While FIG. 2 shows one example of a memory cell, no one particular type or structure of a memory cell is required for the technology disclosed herein. Many different types of memory cells can be used.

Figure 3:
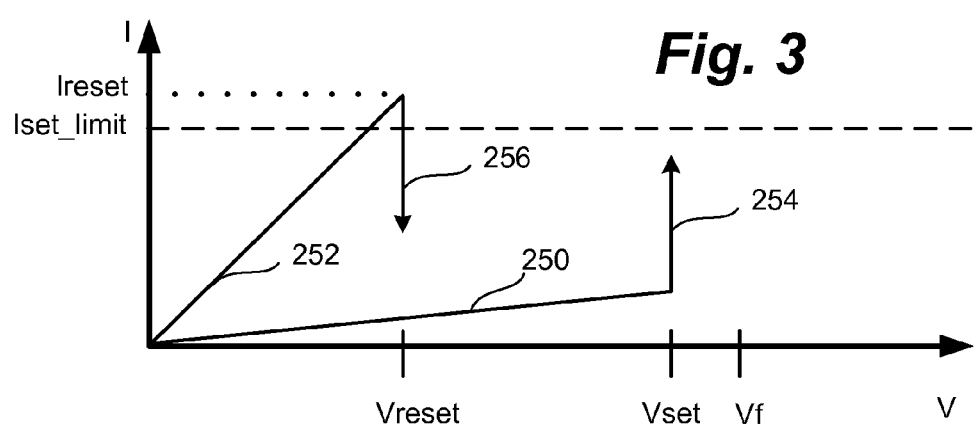
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
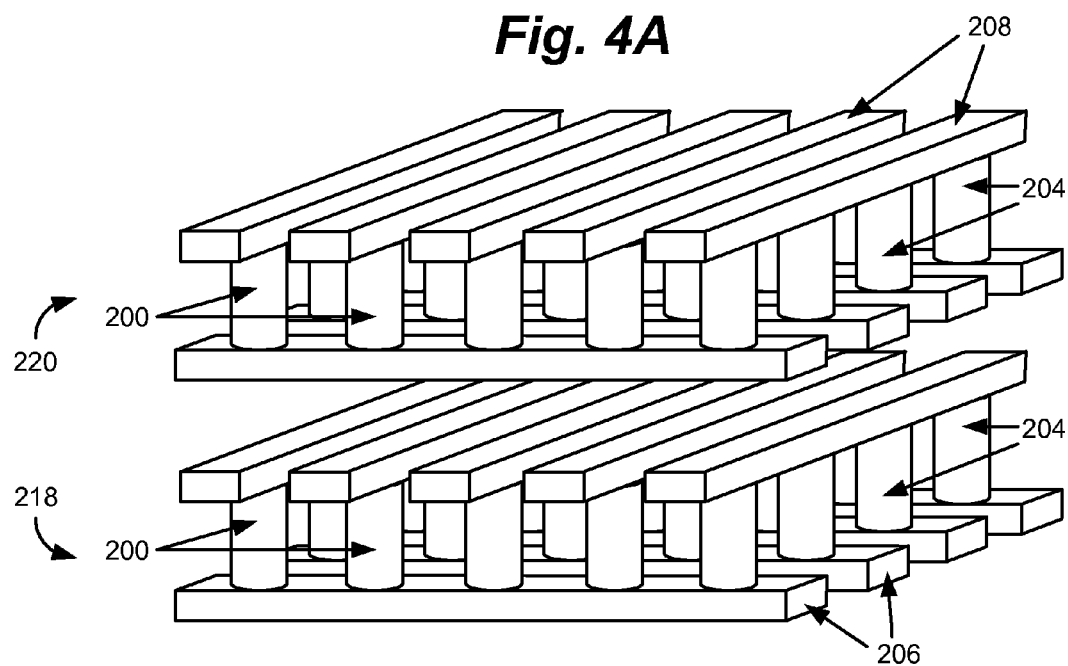
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
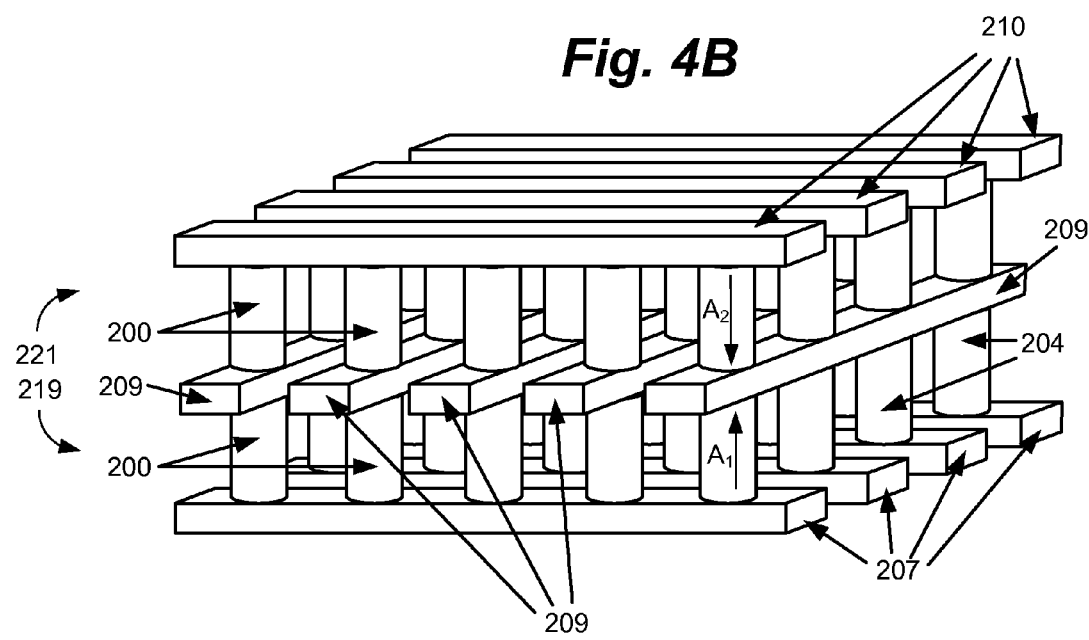
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B.

In the embodiment of FIG. 4B, the diodes (or other steering devices) on adjacent memory levels point in opposite directions in one example. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
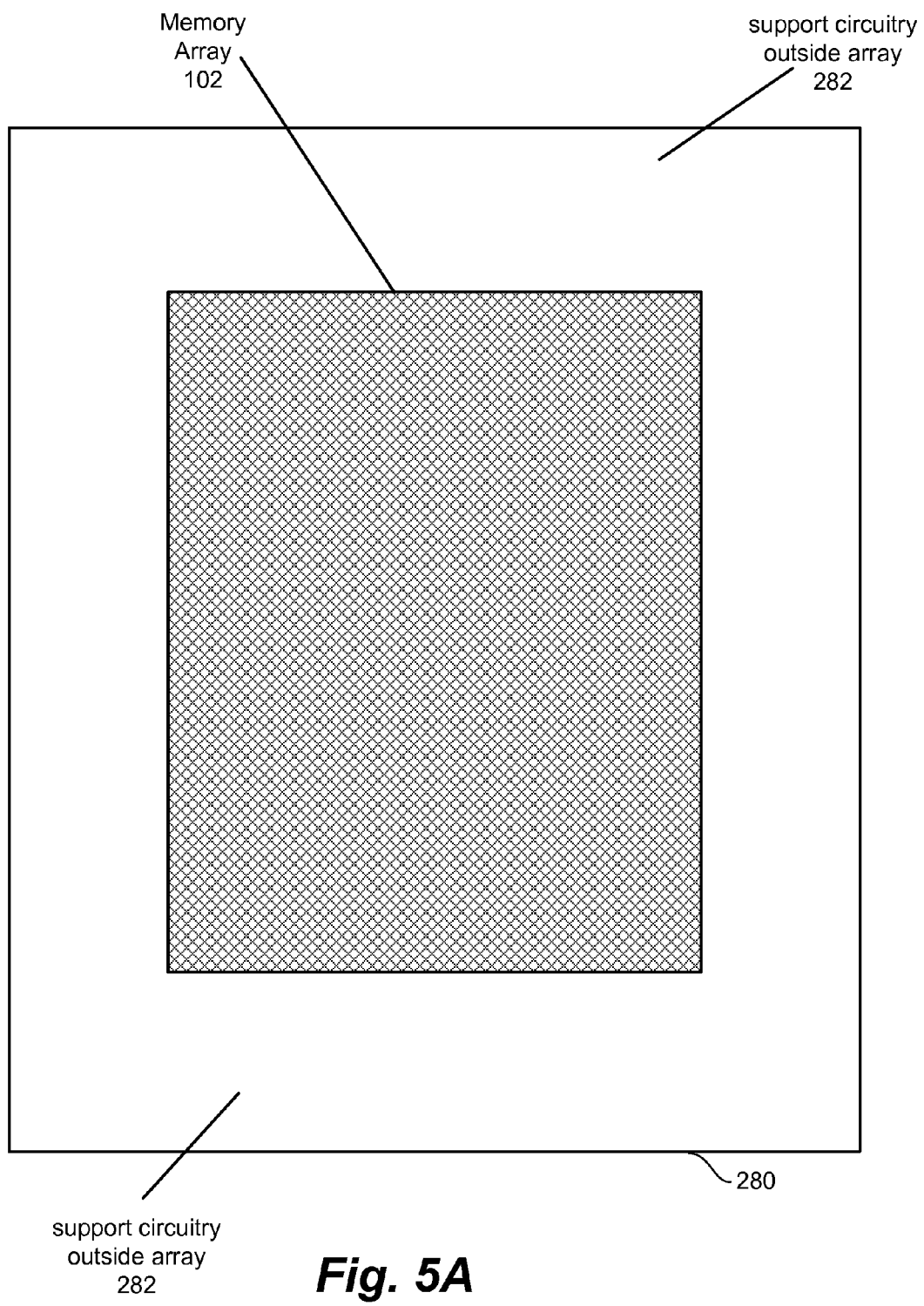
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there are additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
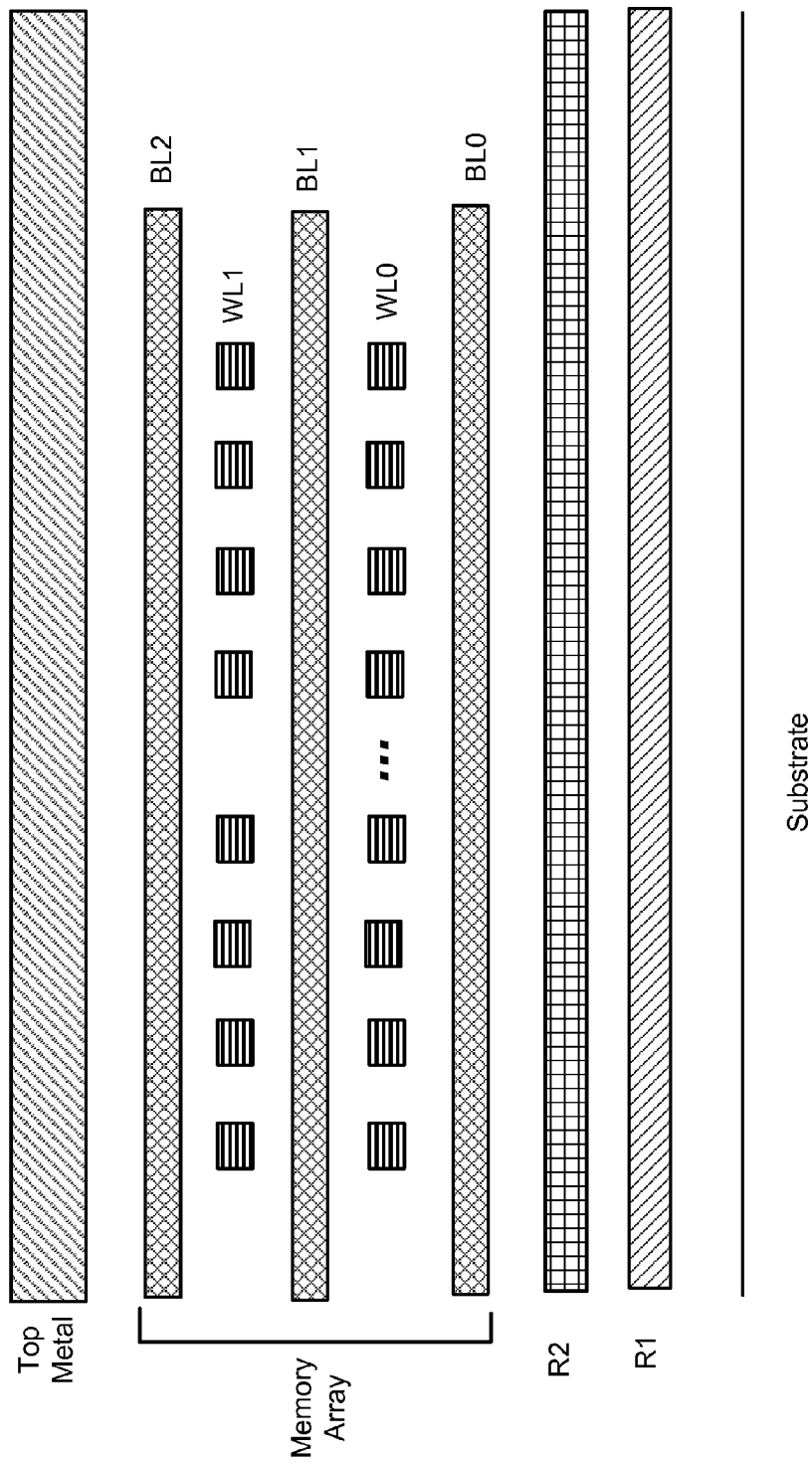
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
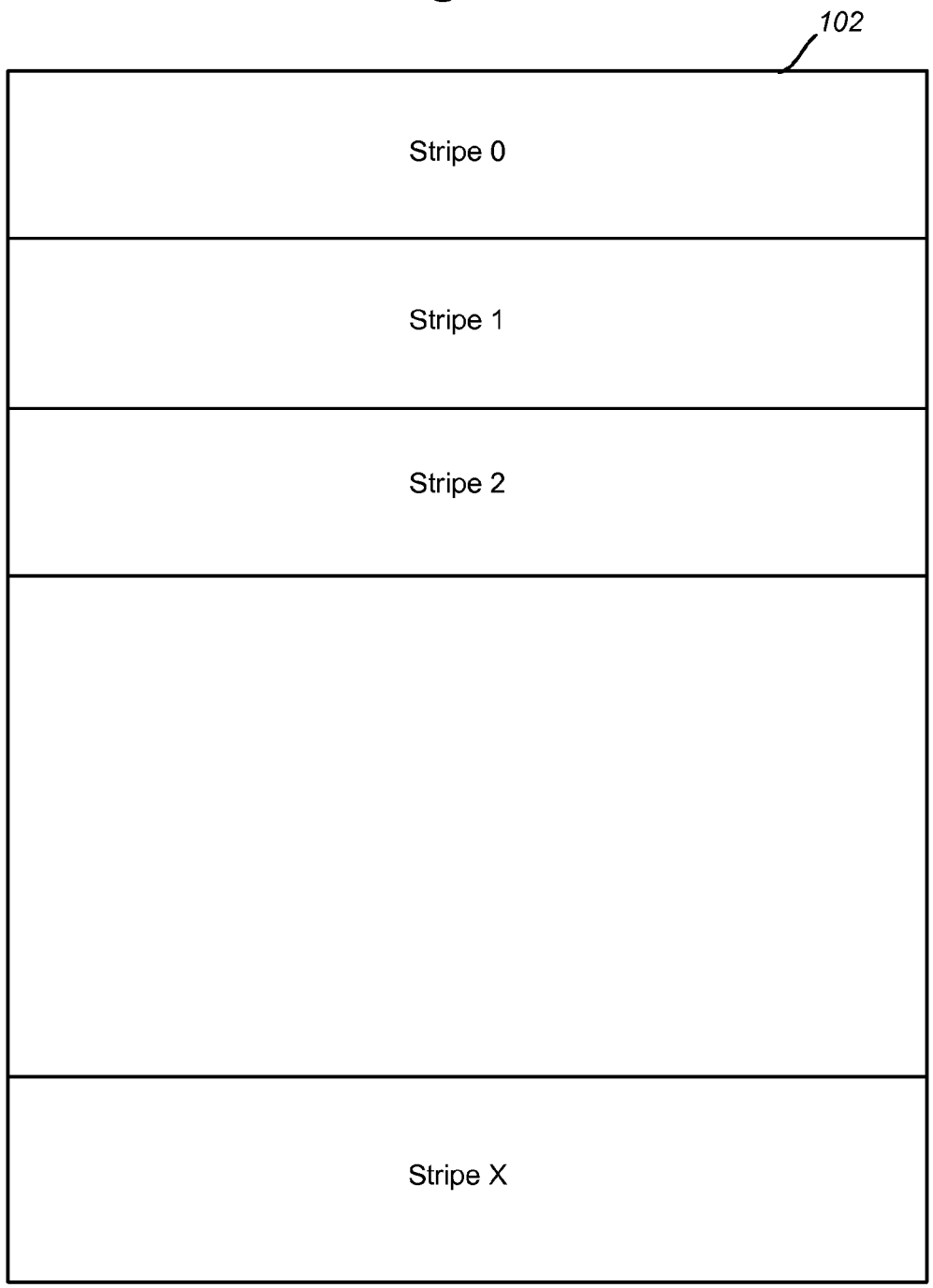
FIG. 6 depicts one example of an organization of a memory array.

Memory array 102 is subdivided into stripes, as depicted in FIG. 6. Each stripe is divided into blocks and blocks are grouped into bays. In one embodiment, each block includes two stripes. In other embodiments, one bay can be implemented in one stripe or a portion of one stripe. In some implementations, a bay can be implemented across all or portions of two or more stripes. Each bay includes multiple blocks. The number of blocks in a bay can vary.

Figure 7:
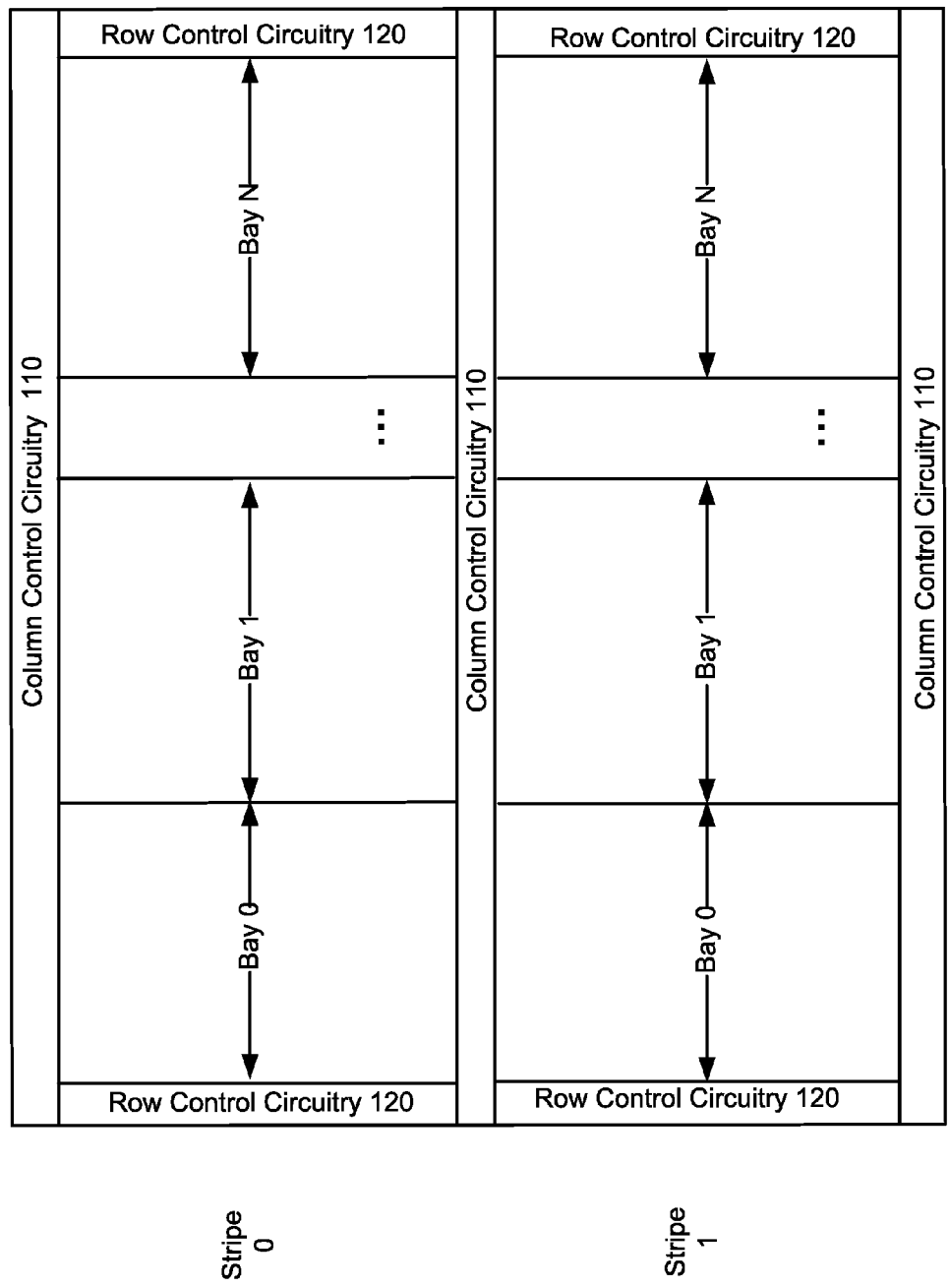
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
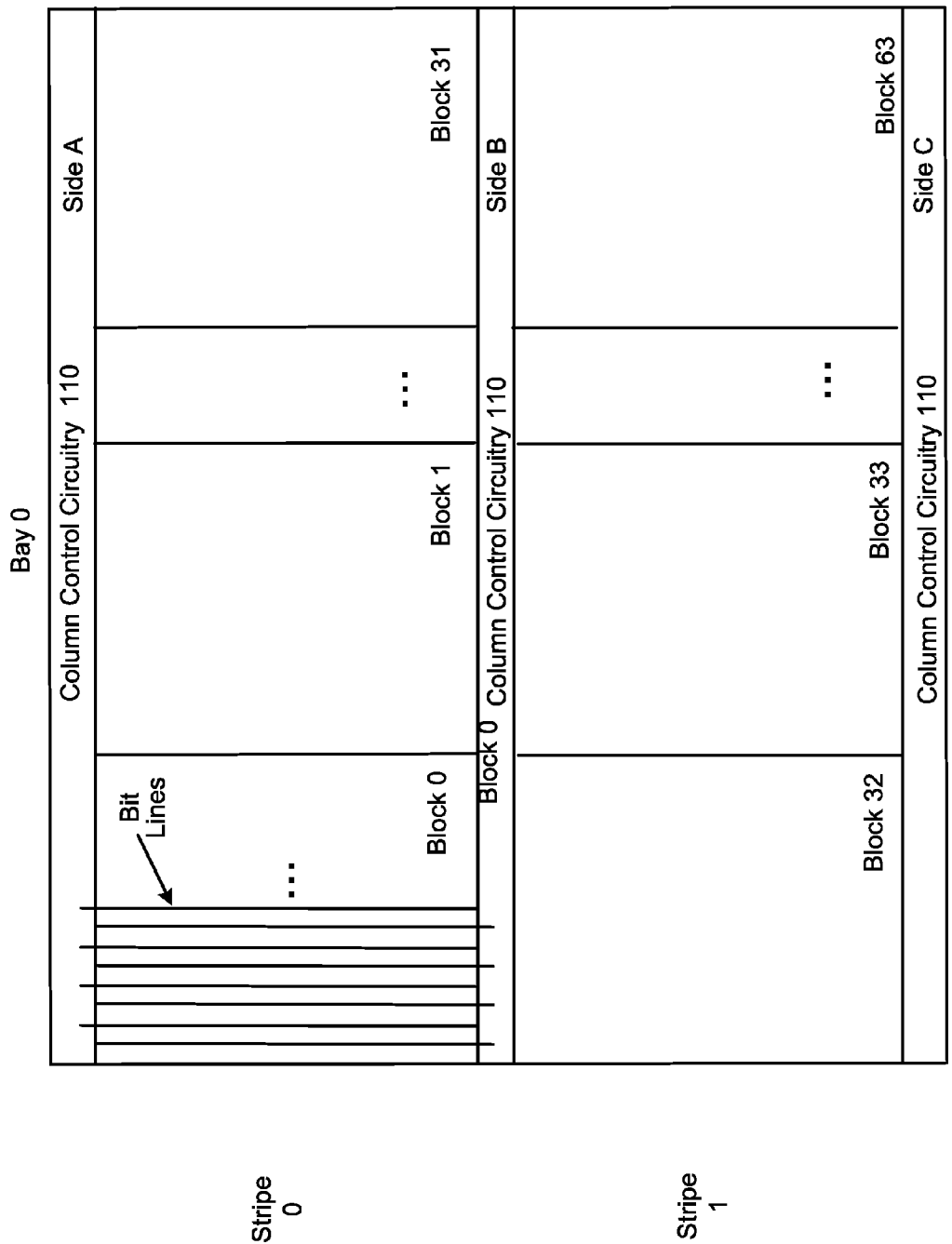
FIG. 8 depicts one embodiment of a bay.

FIG. 8 provides more details of one example of a bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, ..., Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and drive bit lines for its upper or bottom blocks.

In one embodiment, word lines (not depicted in FIG. 8) are shared by two adjacent blocks. For example, half of the word lines connected to Block 1 are also connected to Block 0 and the other half of the word lines connected to Block 1 are also connected to Block 2. In one example, every other word line connected to Block 1 is also connected to Block 0, with the intervening word lines also connected to Block 2. For embodiments with word lines shared by two adjacent blocks, the word line drivers are positioned on the substrate and between the two adjacent blocks. For example, a word line connected to Block 0 and Block 1 is driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

To reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 9:
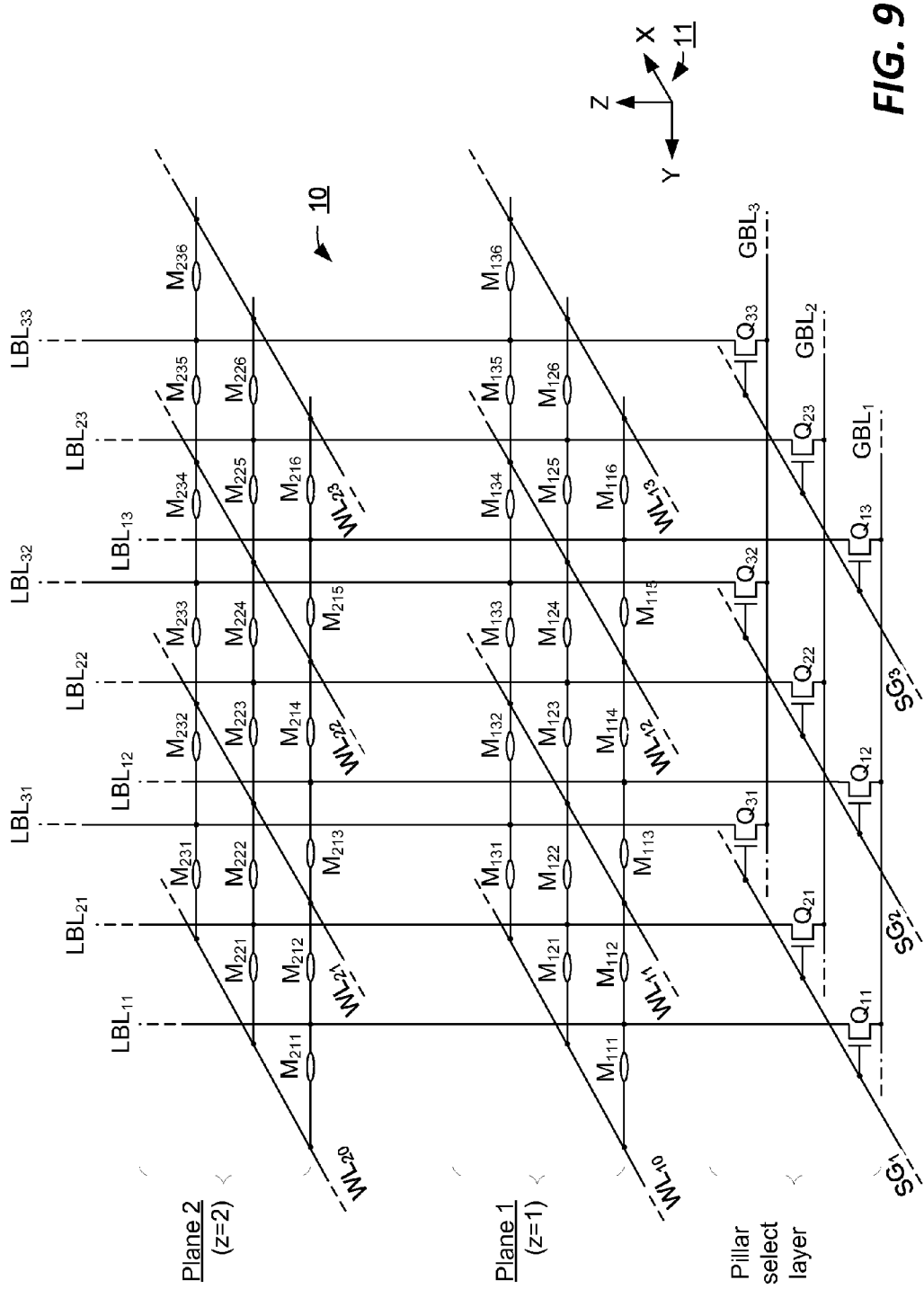
FIG. 9 is an equivalent circuit for a portion of an example three-dimensional array of variable resistance memory elements including a vertical bit line architecture with vertical TFT select devices.

FIG. 9 depicts an architecture of a three-dimensional memory 10 described using a schematic of an equivalent circuit of a portion of the 3D memory. A standard three-dimensional rectangular coordinate system 11 is used for reference, the directions of each of vectors x, y and z being orthogonal with the other two. In another embodiment direction x and y are substantially 60 degrees from each other. The array in FIG. 9 includes vertical bit lines.

A circuit for selectively connecting internal memory elements with external data circuits is formed using select devices $Q_{xy}$, where x gives a relative position of the device in the x-direction and y its relative position in the y-direction. The individual select devices $Q_{xy}$ are vertical TFTs in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above a substrate (which may be below the pillar select layer). Two planes 1 and 2 are illustrated in FIG. 1 but there will typically be additional planes such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

Figure 10:
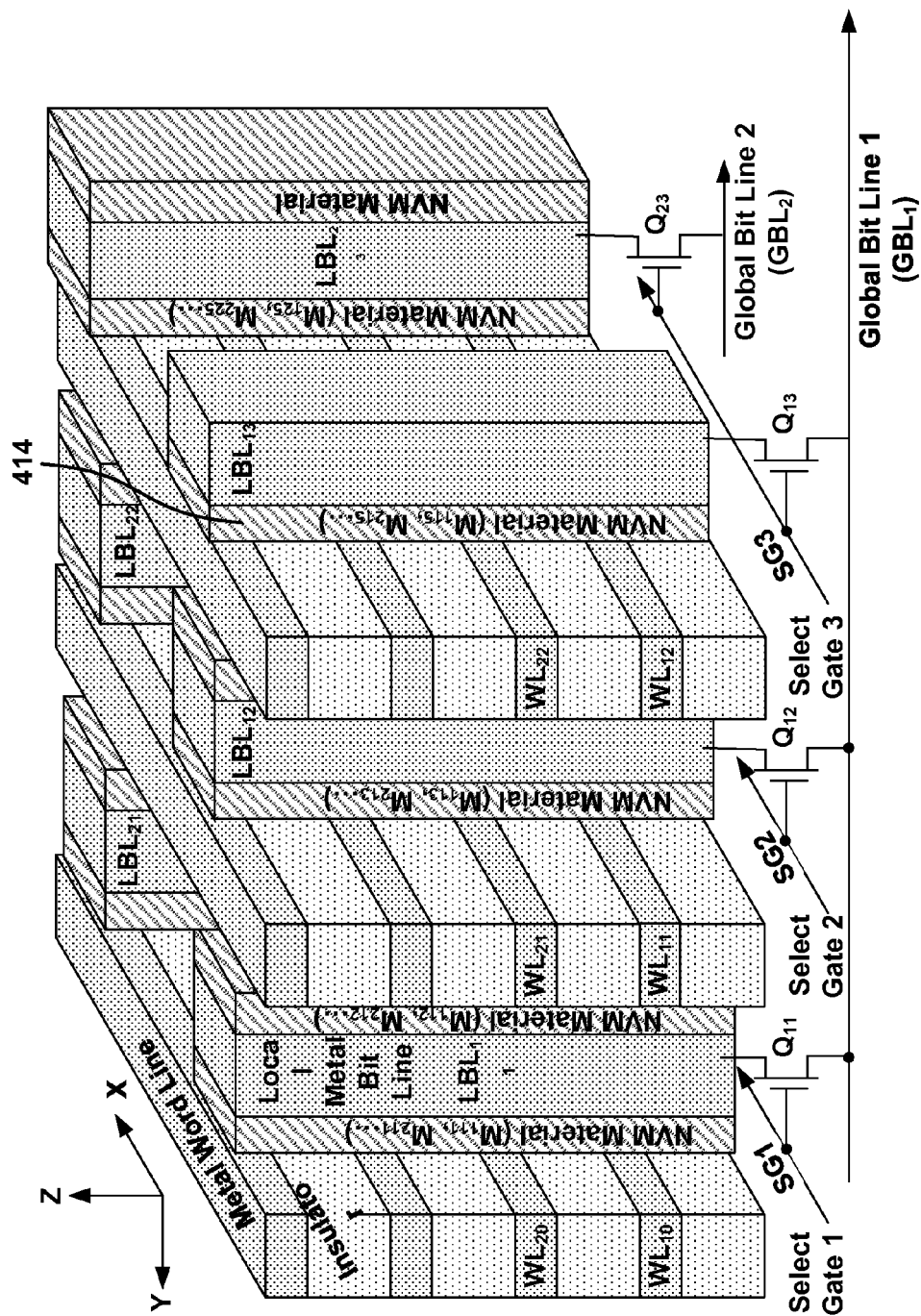
FIG. 10 is an isometric view of a portion of the three-dimensional array shown in FIG. 9 according to a one example of an implementation.

FIG. 10 depicts one embodiment of a portion of a monolithic three-dimensional memory array that includes vertical strips of a non-volatile memory material. The physical structure depicted in FIG. 10 may include one implementation for a portion of the monolithic three-dimensional memory array depicted in FIG. 9. The vertical strips of non-volatile memory material may be formed in a direction that is perpendicular to a substrate (e.g., in the Z direction).

A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may include a single continuous layer of material that may be used by a plurality of memory cells or devices.

In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$.

In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may include a MOS device (e.g., an NMOS device) or a vertical TFT.

Figure 11:
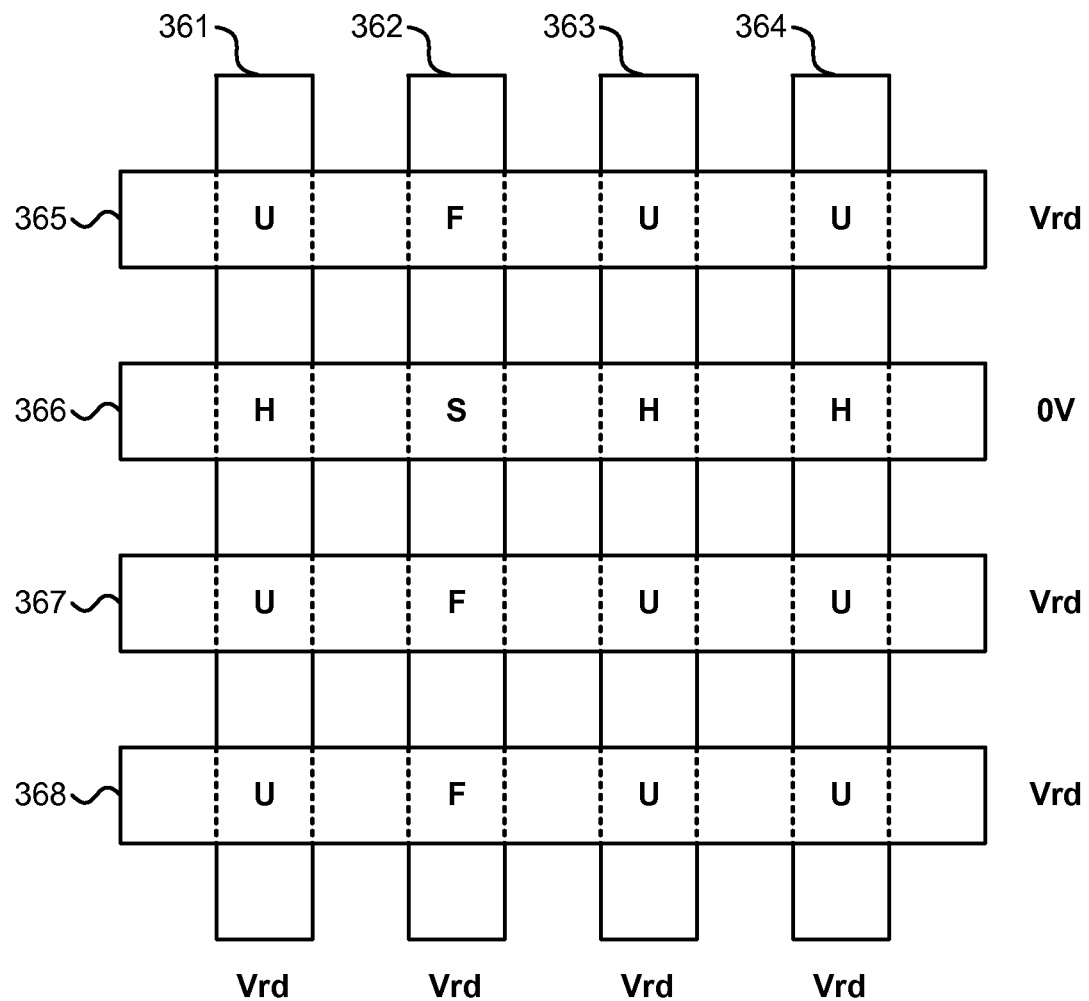
FIG. 11 depicts a portion of a memory array and bias conditions for a forward read operation.

FIG. 11 depicts a portion of a cross-point memory array such as the arrays depicted in FIG. 4A, 4B, 9 or 10. The memory array includes word lines 365-368 and bit lines 361-364. Word line 366 is a selected word line and bit line 362 is a selected bit line. At the intersection of selected word line 366 and selected bit line 362 is a selected memory cell (an S cell). The voltage across the S cell is the difference between the selected word line voltage and the selected bit line voltage.

Memory cells at the intersections of selected word line 366 and unselected bit lines 361, 363, and 364 include unselected memory cells (H cells). H cells are unselected memory cells that share a selected word line that is biased to the selected word line voltage. The voltage across H cells is the difference between the selected word line voltage and the unselected bit line voltage.

Memory cells at the intersections of selected bit line 362 and unselected word lines 365, 367, and 368 include unselected memory cells (F cells). F cells are unselected memory cells that share a selected bit line that is biased to a selected bit line voltage. The voltage across F cells is the difference between the unselected word line voltage and the selected bit line voltage.

Memory cells at the intersections of the unselected word lines 365, 367, and 368 and the unselected bit lines 361, 363, and 364 include unselected memory cells (U cells). The voltage across U cells is the difference between the unselected word line voltage and the unselected bit line voltage.

The number of F cells is related to the length of the bit lines (or the number of memory cells connected to a bit line), whereas the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

FIG. 11 depicts a set of bias conditions for performing a forward bias read operation. With the storage elements configured from the bit lines to the word lines, a positive bias may be created across a selected memory cell by applying a positive read voltage Vrd to the selected bit line while grounding or applying 0V to the selected word line. A memory cell in a low resistance state will cause a larger current flow from the sense amplifier to the selected bit line, through the selected memory cell, and to the selected word line. The unselected word lines and the unselected bit lines are biased at Vrd to turn off the unselected memory cells and inhibit a large current flow through them.

Figure 12:
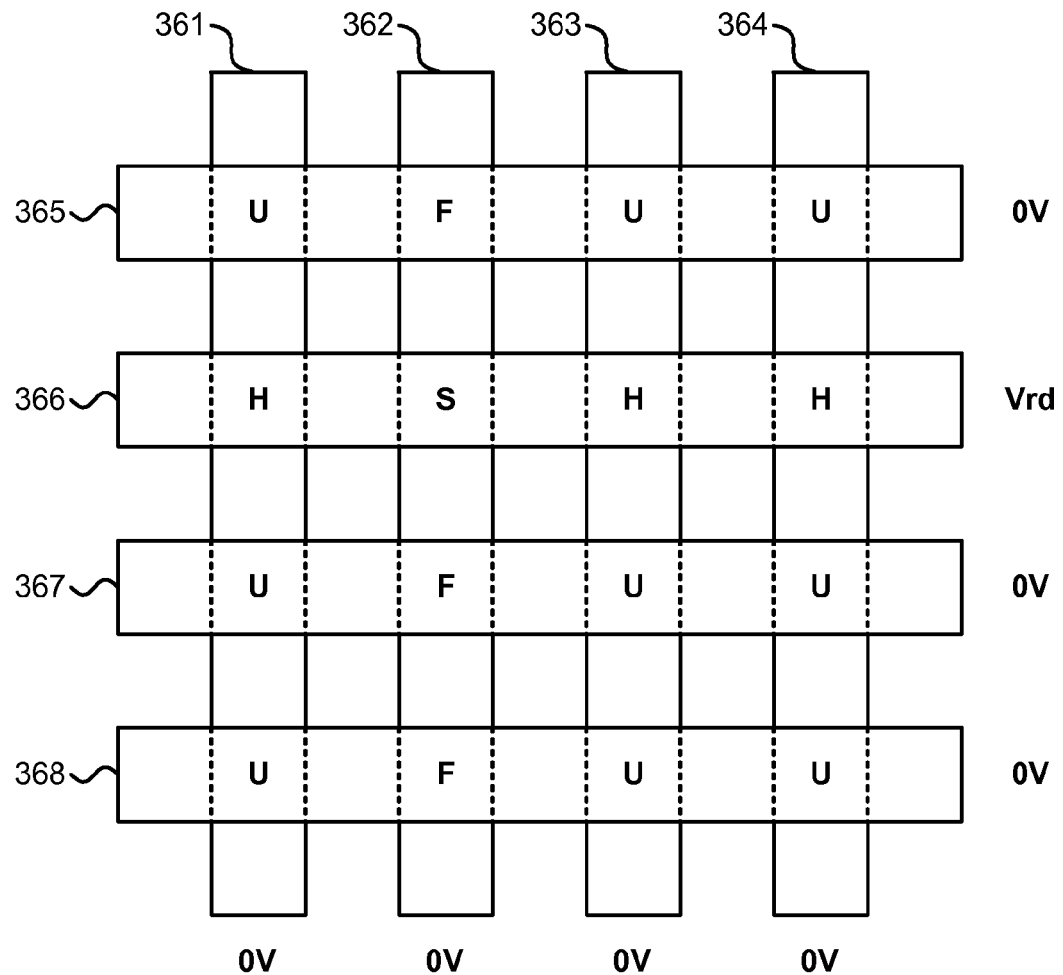
FIG. 12 depicts a portion of a memory array and bias conditions for a reverse read operation.

FIG. 12 depicts the memory array from FIG. 11 with a set of voltages for performing a reverse bias read operation. A reverse bias may be created across a selected memory cell by applying a positive read voltage Vrd to the selected word line while grounding or applying 0V to the selected bit line. A memory cell in a low resistance state will cause a larger current flow from the selected word line through the selected memory cell to the selected bit line and on to the sense amplifier. In a reverse bias read operation, the unselected word lines and the unselected bit lines are biased at 0V or ground to turn off the unselected memory cells and inhibit a large current flow through them. In a reverse read operation, the unselected bit lines and word lines can all be connected to ground directly. This can save voltage resources and reduce the settling time before sensing can be performed.

Figure 13:
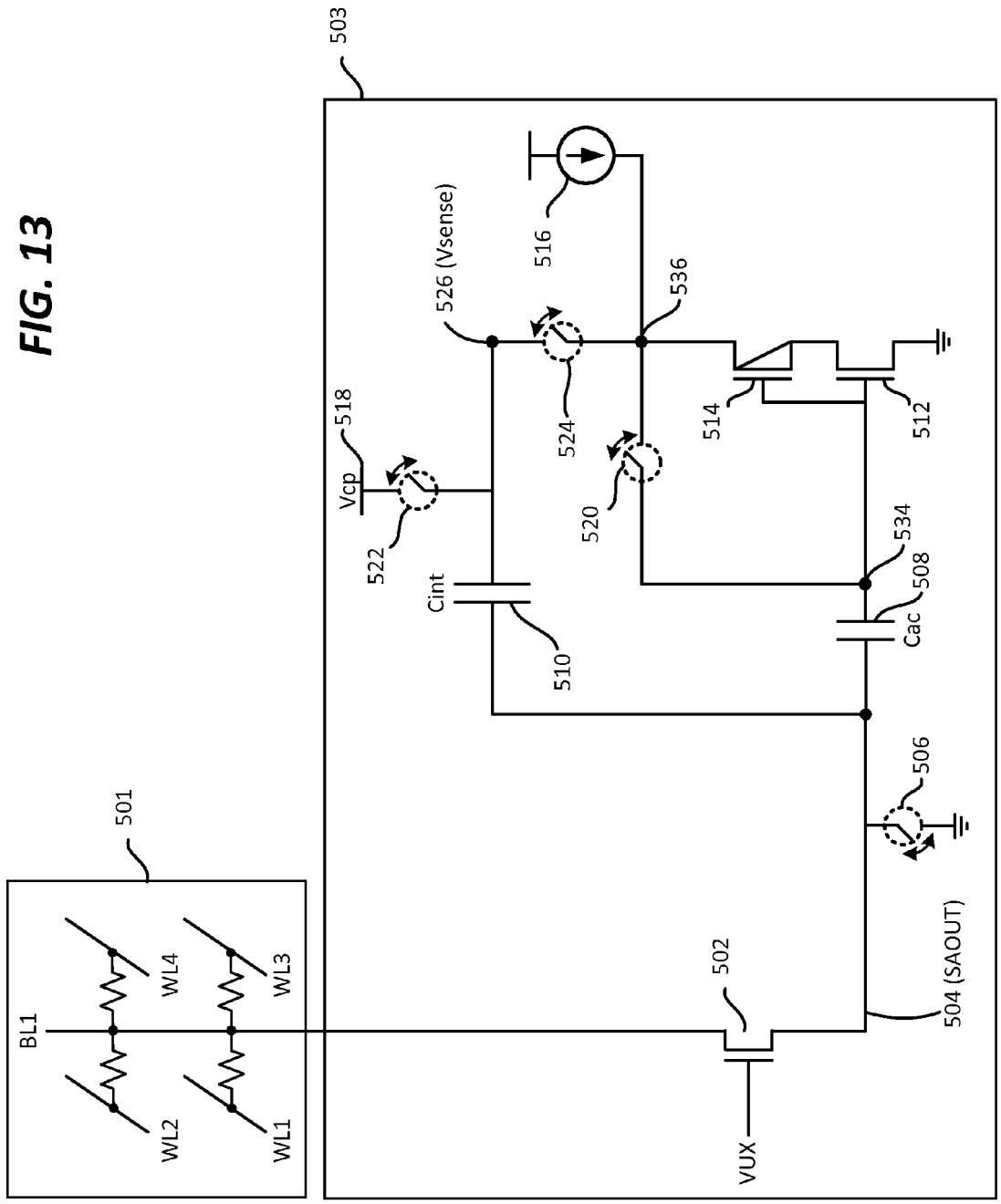
FIG. 13 is a circuit diagram depicting a sense amplifier in accordance with one embodiment.

FIG. 13 is a schematic diagram describing a sense amplifier 503 in accordance with an embodiment of the disclosed technology. Sense amplifier 503 is one example of an implementation of a sense amp 118 as shown in FIG. 1 according to one embodiment of the disclosed technology. Sense amplifier 503 is coupled to a memory array 501, of which a small portion is shown in FIG. 13. The portion of memory array 501 depicted in FIG. 13 includes one bit line BL1 and four word lines WL1, WL2, WL3, and WL4. In a typical implementation, array 501 will include many more bit lines and many more word lines as described above. In one embodiment, the portion of the memory array 501 may include a memory array with bit lines arranged in a direction horizontal to the substrate, such as the memory arrays depicted in FIG. 4A and FIG. 4B. In another embodiment, the portion of the memory array 503 may include a memory array with bit lines arranged in a vertical direction that is perpendicular to the substrate, such as the memory array depicted in FIGS. 9 and 10.

Sense amplifier 503 operates generally to maintain the selected bit line BL1 voltage substantially at 0V during sensing, including during a preset phase and the sense phase. Sense amplifier 501 further operates to maintain the sense amplifier output SAOUT 504 substantially at 0V during the preset and sense phases. SAOUT 504 is coupled to the bit line BL1 through a first transistor 502 having a gate connected to a control voltage VUX, a first terminal connected to the bit line BL1, and a second terminal connected to SAOUT 504. Although not shown, the first terminal of transistor 502 may be connected to a column decoder, which in turn operates to selectively connect a selected bit line such as bit line BL1 to SAOUT 504. SAOUT 504 is further connected to a switch 506 which is configured to selectively connect SAOUT 504 to ground. Switch 506 includes an open position or off state (shown) which disconnects SAOUT 504 from ground, and a closed position or on state (not shown) which connects SAOUT 504 to ground. SAOUT is also connected to a first plate of a first capacitor Cac 508. Cac 508 includes a second plate which is connected to a node 534 positioned between the second plate and the gate of a second transistor 512. Node 534 connects to a second switch 520 which is configured to selectively connect the node 534, and consequently the second plate of Cac 508 and the gate of transistor 512 to a current source 516. Current source 516 provides a bias current that is used to precharge Cac 508 during the present phase and to maintain node 534 at the precharge level during the sense phase. Node 534 is also connected to the gate of a third transistor 514. The third transistor 514 is formed in series with the second transistor 512. A first terminal of transistor 514 connects to a node 536 which in turn connects to the current source 516, the second switch 520, and a third switch 524. A second terminal of transistor 514 connects to a first terminal of transistor 512. A second terminal of transistor 514 is connected to ground.

SAOUT 504 is also connected to the first plate of a second capacitor Cint 510. Cint 510 is an integrating capacitor that is configured to integrate the cell current (also referred to as the bit line current) during the sense phase. Cint 510 includes a second plate that is connected to a sense node 526 which provides a sense voltage Vsense. The second plate further connects to a fourth switch 522, which is in turn connected to a voltage supply 518. Voltage supply 518 provides a positive supply voltage Vcp in FIG. 13. Switch 522 is configured to selectively connect Cint 510 to the voltage supply 518 so that Cint 510 can be precharged during the preset phase. The selected cell current during sensing will discharge the integrating capacitor Cint 510 and consequently the sense node 526 at a rate determined by the resistance of the selected memory cell by placing switching 524 into its closed position.

Although the switches in FIG. 13 are shown as two terminal devices having an open and closed position, other types of switched. For example, three terminal transistor-based switches may be used having an on-state corresponding to a closed switch and an off-state corresponding to an open switch. A control signal can be provided at the gate terminal to turn on (close) and turn off (open) the transistor-based switch.

Figure 14:
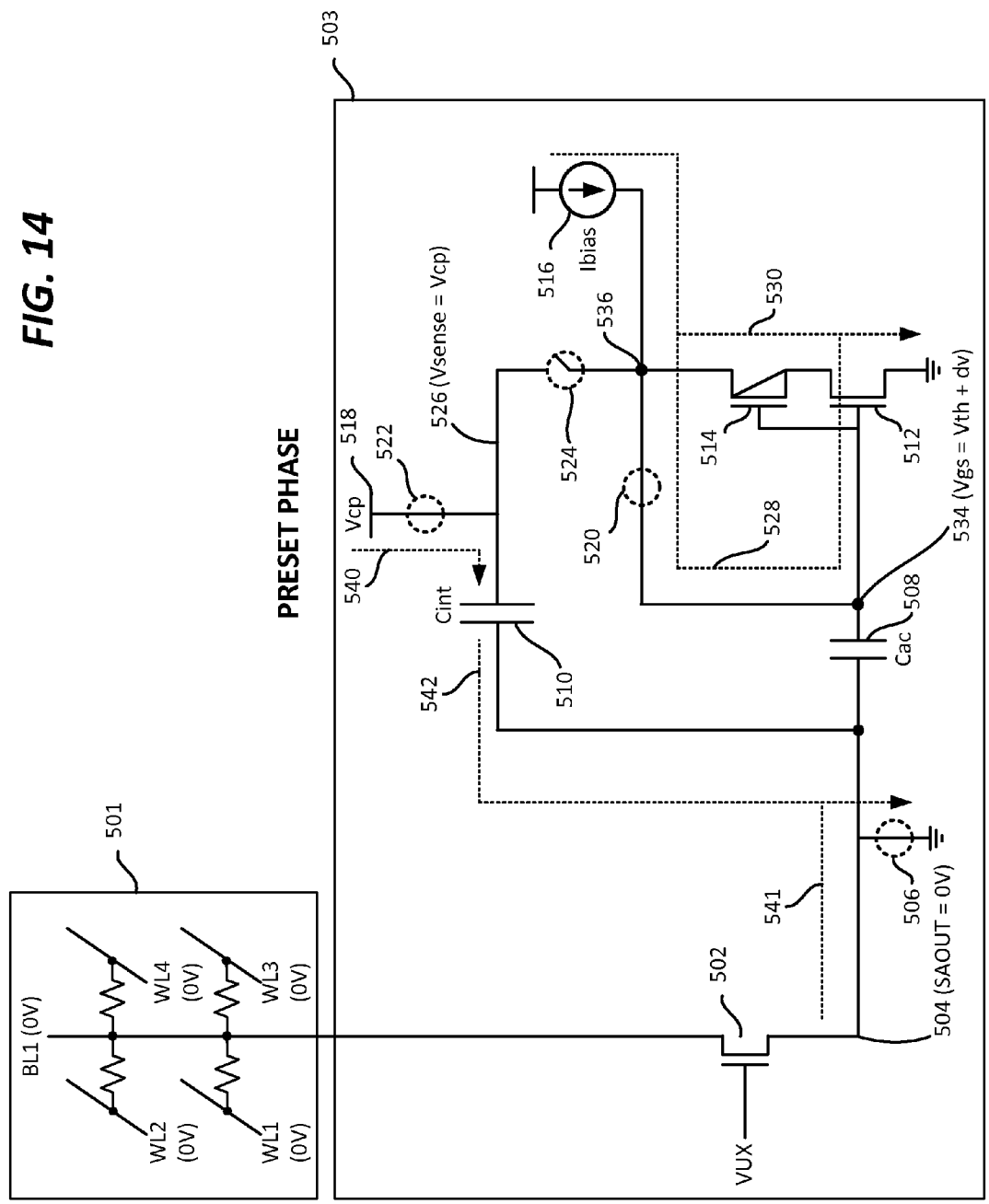
FIG. 14 is a circuit diagram depicting the sense amplifier of FIG. 13 during a preset phase for a read operation.

FIG. 14 depicts sense amplifier 503 and memory array 501 during the preset phase, detailing the bias conditions for both the array and sense amplifier components. During the preset phase, all of the word lines and all of the bit lines are biased to an unselected level. In this example, each bit line and each word line is biased to 0V. VUX is set to a level such as Vrd (approximately 1V in one example) to turn on the first transistor 502 which connects the sense amplifier output SAOUT 504 to the selected bit line BL1. Switch 506 is placed into the closed position so that SAOUT is connected to ground as illustrated by current 541. This places SAOUT at zero volts during the preset phase.

Switch 520 is also placed into its closed position, thereby connecting node 534 to the current source 516. By closing switch 520, a first current 528 (e.g., Ibias) is provided from the current source 516 through transistor 512 to ground. A second current 530 is also provided from the current source 516 through transistor 514 and transistor 512 to ground. The first current 528 precharges node 534 and capacitor 508 to a first voltage. The first voltage is equal to the gate to source voltage (Vgs) of the transistor 512. The gate to source voltage Vgs is set forth in equation 1:

$$Vgs = Vth + dv \qquad \text{Equation 1}$$

Vth is the threshold voltage of transistor 512 and dv is the extra overdrive voltage Vgs voltage needed to pass the drain-to-source current. Thus, capacitor Cac and node 536 are precharged to a level based on the threshold voltage of the transistor 512. Because the preset phase precharges capacitor Cac 508 based on the gate to source voltage across transistor 512, the sense amplifier 503 is adaptive to changes across the different components of the sense amplifier. The gate to source voltage Vgs may vary due to process and temperature variations of the transistor 512. This voltage level will be maintained during the sense phase such that the sense amplifier is able to adapt and generate an accurate sense voltage across various process and temperature corners associated with devices having different operating characteristics.

The integrating capacitor Cint 510 is precharged to the voltage level Vcp of the voltage source 518 during the present phase. Switch 524 is placed into its open position and switch 522 is placed into its closed position during the preset phase. By opening switch 524, the sense node 526 is disconnected from node 536, and consequently the current source 516 and the first terminal of transistor 514. By closing switch 522, the voltage source 518 is connected to the second plate of capacitor Cint 510. Closing switch 522 causes a current 540 to flow to the second plate of capacitor Cint which precharges Cint 510 to the voltage level Vcp of voltage source 518. This in turn induces a current flow 542 from the first plate of capacitor Cint 510 to ground. Additionally, current 540 precharges the sense node 526 to the voltage Vcp of voltage source 518.

Figure 15:
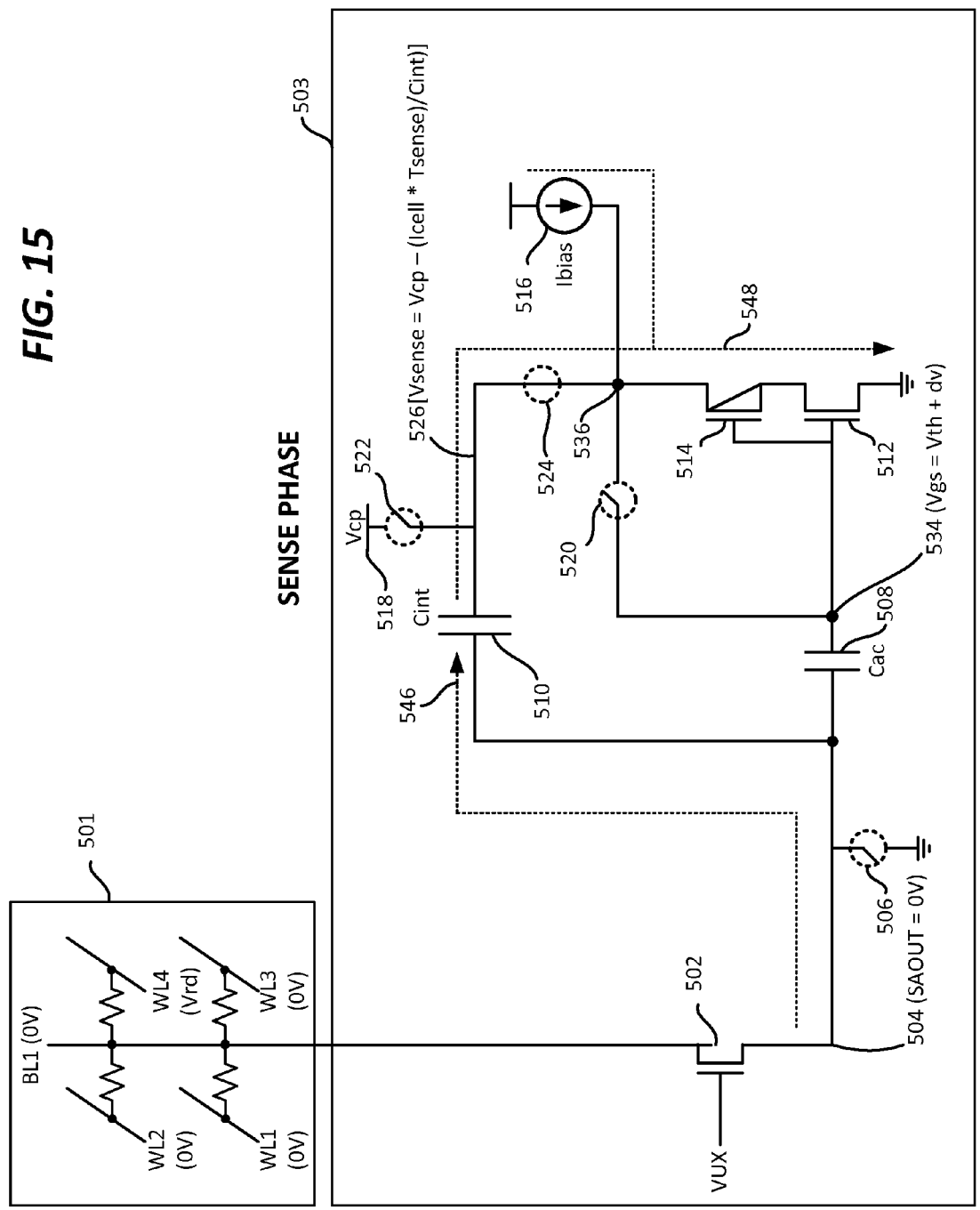
FIG. 15 is a circuit diagram depicting the sense amplifier of FIG. 13 during a sense phase for a read operation.

FIG. 15 depicts sense amplifier 503 and memory array 501 during the sense phase following the preset phase depicted in FIG. 14. During the sense phase, the selected bit line BL1 and the unselected word lines WL1, WL2, and WL3 remain at the unselected levels (e.g., 0V). The selected word line WL4, however, is raised to a read level Vrd. Vrd may vary according to the particular sensing being performed. In one example, Vrd is equal to 1V or substantially 1V. Although a reverse read is described, the circuitry is compatible with forward read operations as described in FIG. 11.

VUX remains at a level such as Vrd to turn on the first transistor 502 so that the sense amplifier output SAOUT 504 remains connected to the selected bit line BL1. Switch 506 is placed into its open position during the sense phase so that SAOUT is disconnected from ground. As will be described below, SAOUT 504 remains at 0V after disconnecting SAOUT from ground due to the biasing of capacitor Cac and feedback provided by transistors 512 and 514.

Switch 520 is placed into its open position during the sense phase, disconnecting node 534, and consequently capacitor 508, from the current source 516. Node 534 and Cac 508 remain at Vgs after opening switch 520 due to precharging Cac 508 during the present phase. Switch 522 is in turn opened to also disconnect capacitor Cint 510 from the voltage supply 518. At the same time, switch 524 is closed to provide a path from capacitor Cint 510 to node 536, and then to ground through transistors 514 and 512. Current source 516 remains connected to node 536 and continues to provide an Ibias current. Because switch 520 is open, the bias current is driven through transistors 514 and 512 only.

With the switch positions and bias conditions shown in the sense phase, the bit line or cell current Icell 546 is driven through SAOUT 504 to capacitor Cint 510. The cell current Icell is integrated on the capacitor Cint 510, which causes the capacitor Cint 510 to discharge. The discharge of capacitor Cint 510 in turn causes the sense node to discharge from its precharge level based on the integration of the cell current. The discharge of capacitor 510 causes the sense node 526 voltage Vsense to decrease from the precharge level Vcp as shown by equation 2:

$$Vsense = Vcp - \frac{Icell * Tsense}{Cint} \qquad \text{Equation 2}$$

Tsense is equal to the sense time and Cint is equal to the capacitance of capacitor 510. Accordingly, a sense node voltage Vsense will develop at the sense node 526 based on the cell current. More specifically, the sense node voltage will develop based on discharging the sense node by integrating the cell current Icell using the integrating capacitor Cint 510. Although not shown, Vsense may be used to determine whether a cell is on or off during sensing. For example, Vsense may be connected to the gate of an output transistor which is formed in series with a strobing transistor. During a strobe, the output transistor will be turned on or off by Vsense. If Vsense is high enough to turn on the output transistor when the strobing transistor is turned on, a precharge level can be drained to ground indicating that the cell was off during sensing. If Vsense is low and thus does not turn on the control transistor, the precharge level is maintained indicating that the cell was on during sensing.

The arrangement in FIGS. 14 and 15 facilitates accurate sensing without requiring an accurate value for Vcp and Ibias. The value of Vcp may vary across different devices, but the sense accuracy will not be affected. The voltage Vcp is used as a precharge level only such that variations in its level will not affect the final value of Vsense. Additionally, this architecture is capable of maintaining the sense amplifier SAOUT at a constant 0V voltage level during the sense phase so that the sense node provides an accurate sense voltage based on the state of a selected cell. This is provided through a feedback loop including both capacitors 508 and 510, and the transistors 512 and 514. For example, if the voltage at SAOUT begins to rise, a corresponding increase in voltage will be seen at the second plate of capacitor Cac 508. When the voltage at the second plate of capacitor 508 increases (node 534), more current will be drawn from current source 516. Ibias is increased, increasing the current 548 through transistors 514 and 512. The increase in current 548 will pull down the voltage level at the sense node 526. When the voltage decreases at the sense node 526, the voltage at SAOUT decreases back to the original level of 0V. Accordingly, capacitors 508 and 510 in conjunction with transistors 512 and 514 provide a feedback loop so that the SAOUT voltage remains at a constant 0V during sensing.

Figure 16:
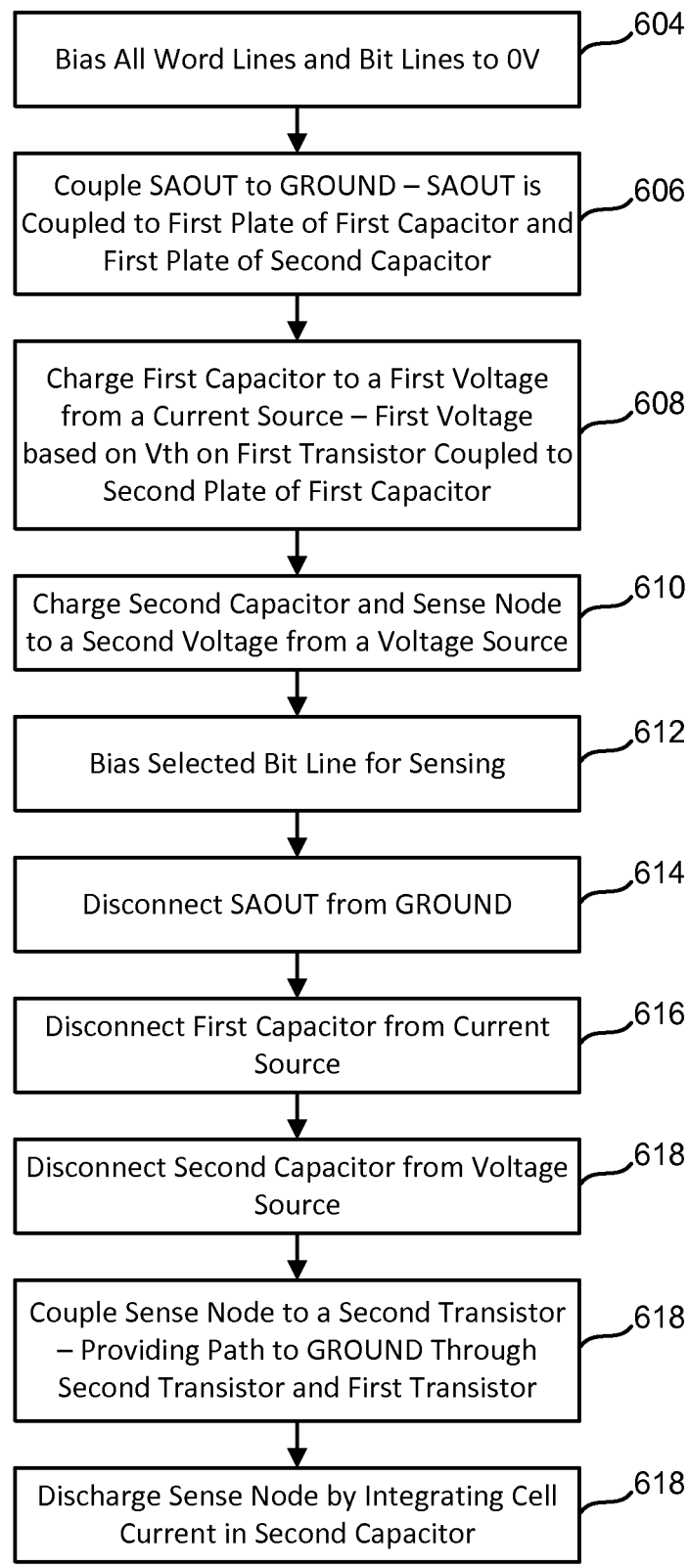
FIG. 16 is a flowchart describing a read operation using the sense amplifier of FIG. 13 in accordance with one embodiment.

FIG. 16 is a flowchart describing a process of sensing that can be performed using the sense amplifier circuitry depicted in FIG. 13. At step 604, both the selected and unselected bit lines and word lines are all biased to an unselected level such as 0V. At step 606, the sense amplifier output SAOUT is coupled to ground. The sense amplifier output is coupled to the first plate of a first capacitor and the first plate of a second capacitor as shown in FIG. 14. At step 608, the first capacitor is charged to a first voltage using a current source. The first voltage of the first capacitor is dependent upon the threshold voltage Vth of a first transistor having a gate that is coupled to the second plate of the first capacitor. At step 610, the second capacitor is charged to a second voltage using a voltage source. The second capacitor is charged to the voltage level of the voltage source.

After precharging both capacitors, the selected word line is biased to a read voltage (e.g., Vrd) at step 612. The unselected word lines and all of the bit lines are biased to an unselected voltage (e.g. 0V). In an alternate embodiment the selected bit line can be biased to the read voltage (e.g. Vrd) and the selected word line is biased to 0V. These voltages provide alternative bias conditions for performing a forward read operation.

At step 614, the sense amplifier output SAOUT is disconnected from ground. As earlier described, the architecture of FIG. 13 nevertheless maintains SAOUT at 0V, even after disconnection from ground. At step 616, the first capacitor is disconnected from the current source. At step 618, the second capacitor is disconnected from the voltage source. At step 618, the sense node is coupled to a second capacitor which is formed in series with the first transistor. The first and second transistors provide a path to ground from the sense node. At step 618, the sense node is discharged by integrating the cell current in the second capacitor. Step 618 provides a voltage at the sense node based on the resistance of the selected cell. If a cell is conductive during sensing, the sense node voltage will discharge due to the cell current integrated by the second capacitor. If a cell is not conductive, the sense node will not discharge (or will not discharge as much as with a conductive cell) due to there being little or no cell current in the bit line.

Figure 17:
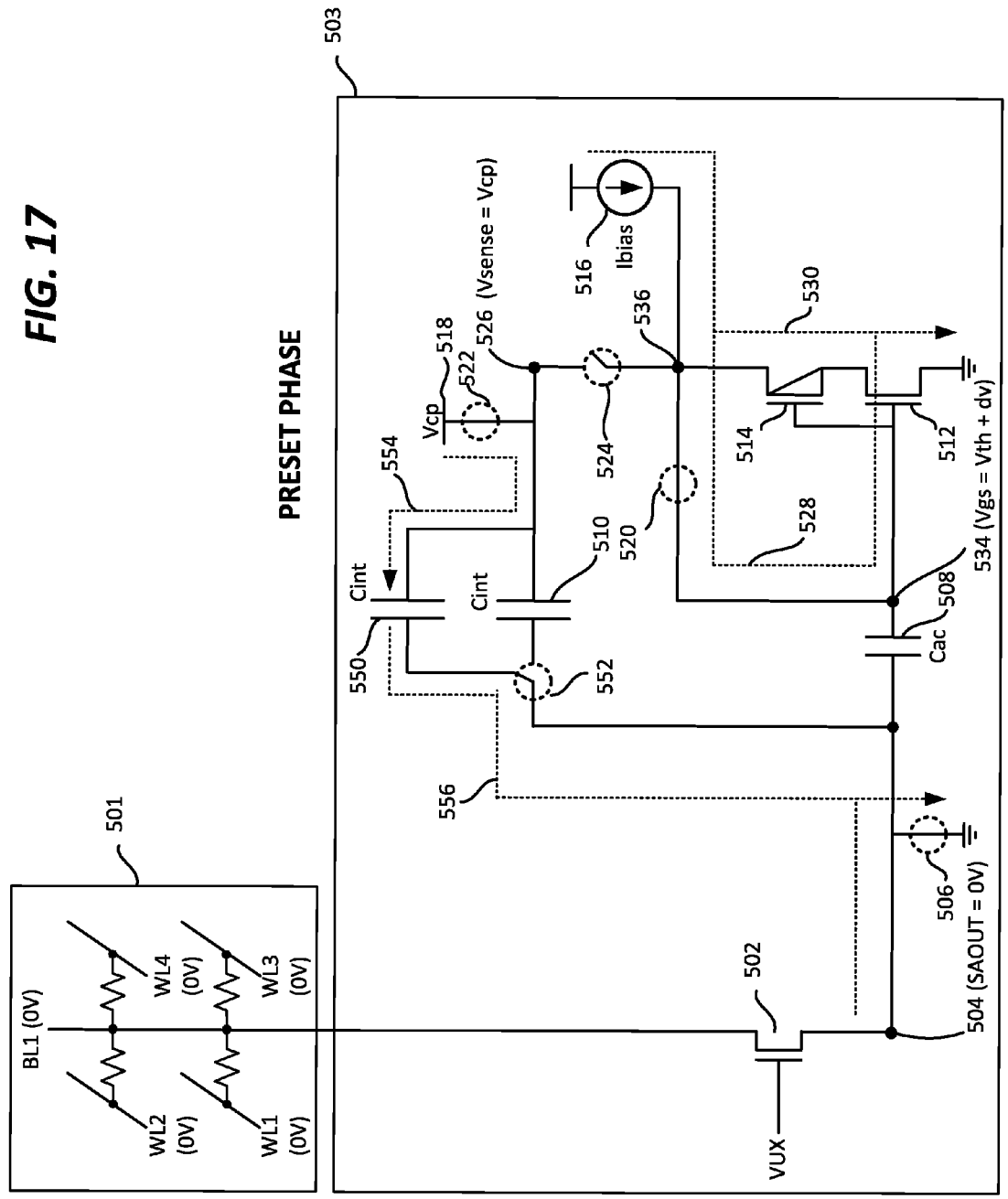
FIG. 17 is a circuit diagram depicting the sense amplifier of FIG. 13 with an additional capacitor during a preset phase for integrating a background current.
Figure 18:
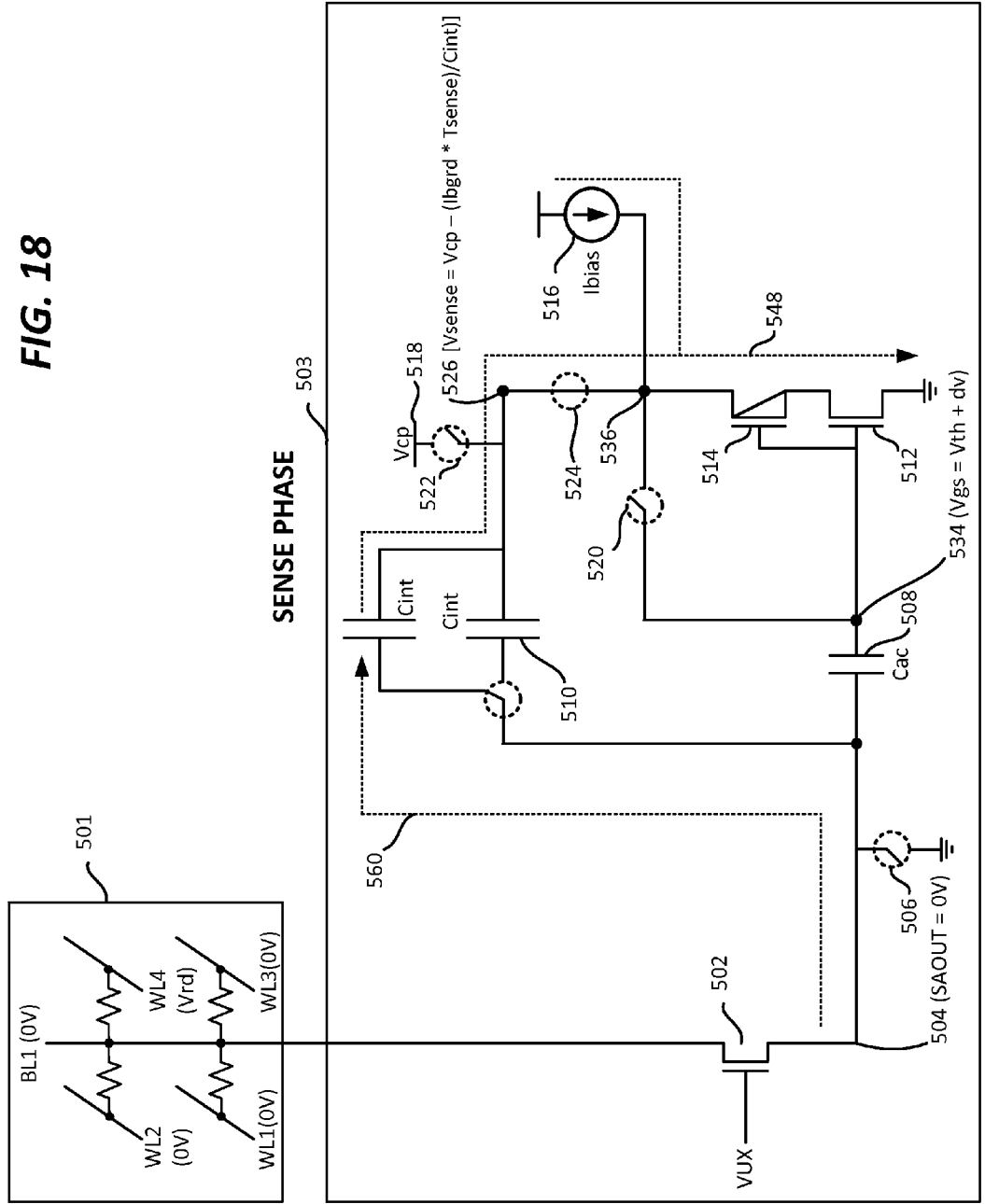
FIG. 18 is a circuit diagram depicting the sense amplifier of FIG. 17 during a sense phase for integrating a background current.

In one embodiment, an additional integrating capacitor can be placed in parallel with capacitor Cint 510 to facilitate the removal of background currents from the sense results. FIGS. 17 and 18 depict sense amplifier 503 with an additional integrating capacitor Cint 550 formed in parallel with capacitor Cint 510. A switch 552 is provided that in a first position connects SAOUT 504 to the first plate of capacitor 510 and in a second position, disconnects SAOUT 504 from capacitor 510 and connects SAOUT 504 to a first plate of capacitor 550. Switch 552 can be placed into the second position during a second preset phase shown in FIG. 15 so that capacitor Cint 550 is precharged to the voltage supply level Vcp. Placing switch 552 into the second position and closing switch 522 causes a current 554 to flow to the second plate of capacitor Cint 550 which precharges Cint 550 to the voltage Vcp of voltage source 518. This in turn induces a current flow 556 from capacitor Cint 550 to ground. Additionally, current 554 precharges the sense node 526 to the voltage Vcp of voltage source 518.

A second sense phase is then performed as shown in FIG. 18. During this second sense phase, all of the word lines and the bit line are biased to 0V. Switch 552 is in the second position so that capacitor 550 is connected to SAOUT and capacitor 510 is disconnected from SAOUT. In this manner, the only current in the bit line is from background noise, and not the actual cell current. The background noise current 560 is labeled Ibgrd. The integrating capacitor Cint 550 is discharged by integrating the background current Ibgrd. The integration of the background current discharges the sense node 526 as shown in Equation 3:

$$Vsense = Vcp - \frac{Ibgrd * Tsense}{Cint} \quad \text{Equation 3}$$

After performing the sense phase with all of the word lines at 0V using the capacitor Cint 550, the value of Vsense during the background current sense phase can be subtracted from the value of Vsense during the cell current sense phase. In this manner, the effects of the background noise during the cell current sense phase can be removed to provide a more accurate sensing based on the cell current alone. The additional preset phase and the additional sense phase can be performed before performing the preset and sense phase for determining the cell current, or after performing the preset phase and sense phase for determining the cell current.

Figure 19:
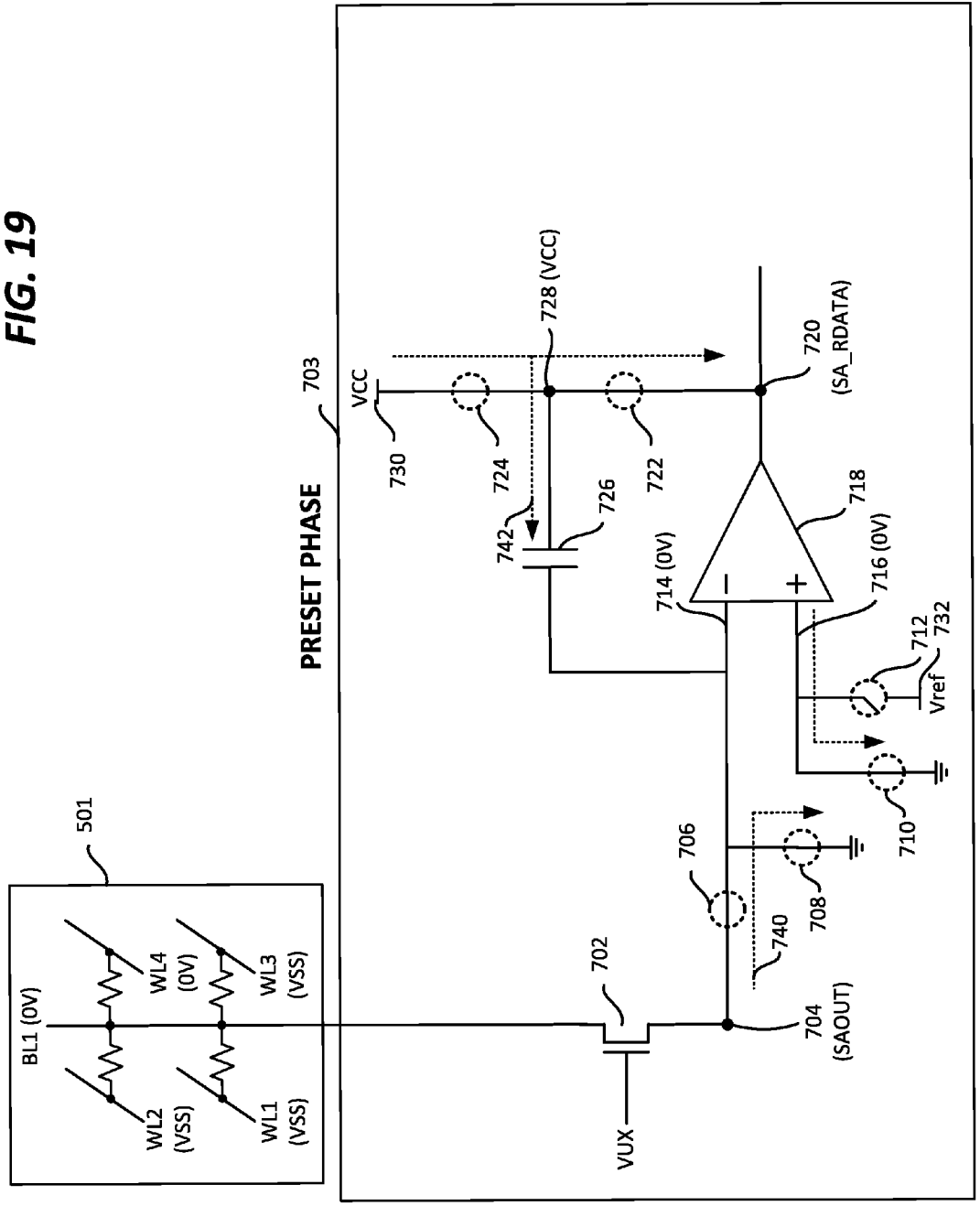
FIG. 19 is a circuit diagram depicting a sense amplifier in accordance with one embodiment during a preset phase for a read operation.

FIG. 19 is a circuit diagram of a sense amplifier circuit 703 according to another embodiment of the disclosure. In FIG. 19, an operational amplifier 718 such as an operational transconductance amplifier (OTA) is used to control the bit line voltage during a read operation. The OTA is configured to maintain a constant voltage (e.g. 0V) or a substantially constant voltage at the sense amplifier output SAOUT 704 during the read operation.

FIG. 19 describes a preset phase during which a sense capacitor 726 is precharged to a first voltage (e.g., VCC) from a voltage source 730. During the preset phase the bit line is at 0V and the selected word line is at 0V. The unselected word lines are at VSS. VSS is 0V in this example but other voltages may be used.

Voltage source 730 is coupled to a first switch 724 which is closed during the present phase to provide a path for a voltage supply current 742 to the sense capacitor 726. The voltage source precharges the second plate of capacitor 726 and a node 728 coupled to the second plate of capacitor 726 to VCC. A second switch 728 is coupled between the first switch and an output node 720 that provides sense amp read data (SA_RDATA). Switch 728 is closed during the preset phase. SAOUT 704 is coupled between a first transistor 702 that couples SAOUT to the memory array 501 and a third switch 706. The third switch 706 is also coupled to a negative input node 714 of OTA 715. A fourth switch 708 is coupled between the input 714 and ground. During the present phase, switches 706 and 708 are both closed, providing a path for a current 740 from SAOUT to ground. By closing switches 706 and 708, the negative input node 714 is driven to 0V. OTA 718 includes a positive input node 716 which is coupled to switches 710 and 712. Switch 710 is coupled to ground and switch 712 is coupled to a second voltage source 732. During the preset phase, switch 710 is closed and switch 712 is open. The positive input node 716 is coupled to ground through switch 710, resulting in 0V at the input node 716.

Figure 20:
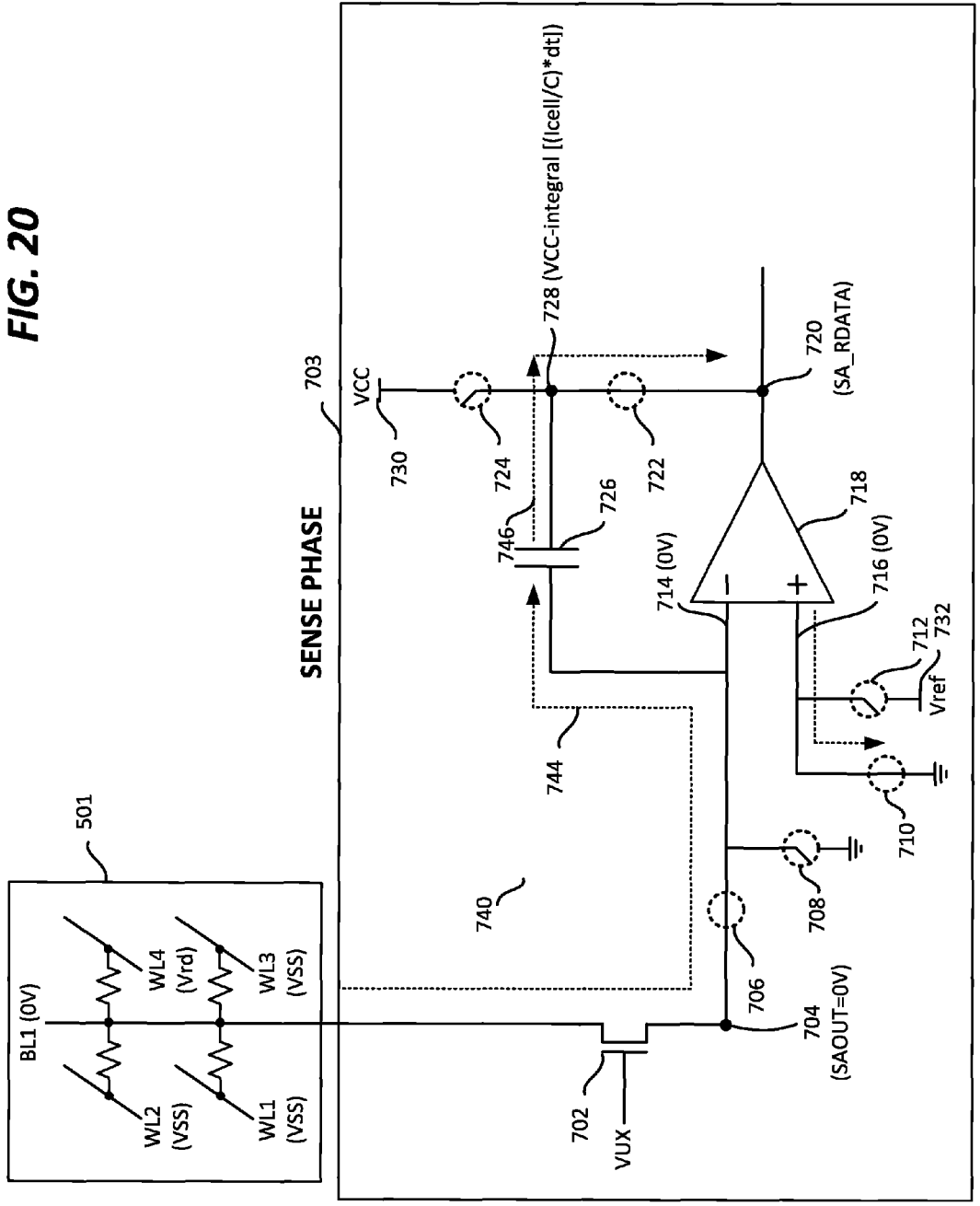
FIG. 20 is a circuit diagram depicting the sense amplifier of FIG. 19 during a sense phase for a read operation in accordance with one embodiment.

FIG. 20 depicts the sense amplifier circuit 703 during a sense phase that follows the preset phase. In the sense phase, the selected bit line BL1 remains at 0V, while the selected word line WL4 is raised to Vrd. The unselected word lines remain at VSS. Switch 706 remains closed, while switch 708 is opened to isolate SAOUT from ground. Switch 724 is opened to disconnect the sense capacitor 726 from the voltage source 730. Switch 722 remains closed. With the switches in this configuration, the cell current 744 is routed to the first plate of the sense capacitor 726. The cell current (Icell) 744 is integrated by the sense capacitor 726, which induces a current 746 that passes through a node 728 coupled to the second plate of the sense capacitor. Current 746 discharges node 728 according to Equation 4:

$$V = VCC - \int \frac{Icell}{C} * dt \quad \text{Equation 4}$$

The voltage V at node 728 is discharged from the precharge level of VCC based on the integrated cell current. The voltage will decrease by the integration of the cell current divided by the capacitance of capacitor 726 over time dt.

The input nodes 714 and 716 of OTA 718 remain at substantially 0V during the sense phase. The voltage at the negative input node 714 is fixed by the OTA to capacitor 726 loop. Switch 710 remains closed while switch 712 remains open. The positive input node 716 is coupled to ground through switch 710 so that it remains at 0V.

After the sense phase, a comparison phase is performed to compare the voltage based on the cell current Icell to a reference voltage to determine whether the cell at BL1 and WL4 is on or off under the applied bias conditions. The bias conditions at the memory array 501 may vary as the array is isolated from the sense amplifier during the comparison phase. In one example, the bias conditions remain the same as during sensing.

Figure 21:
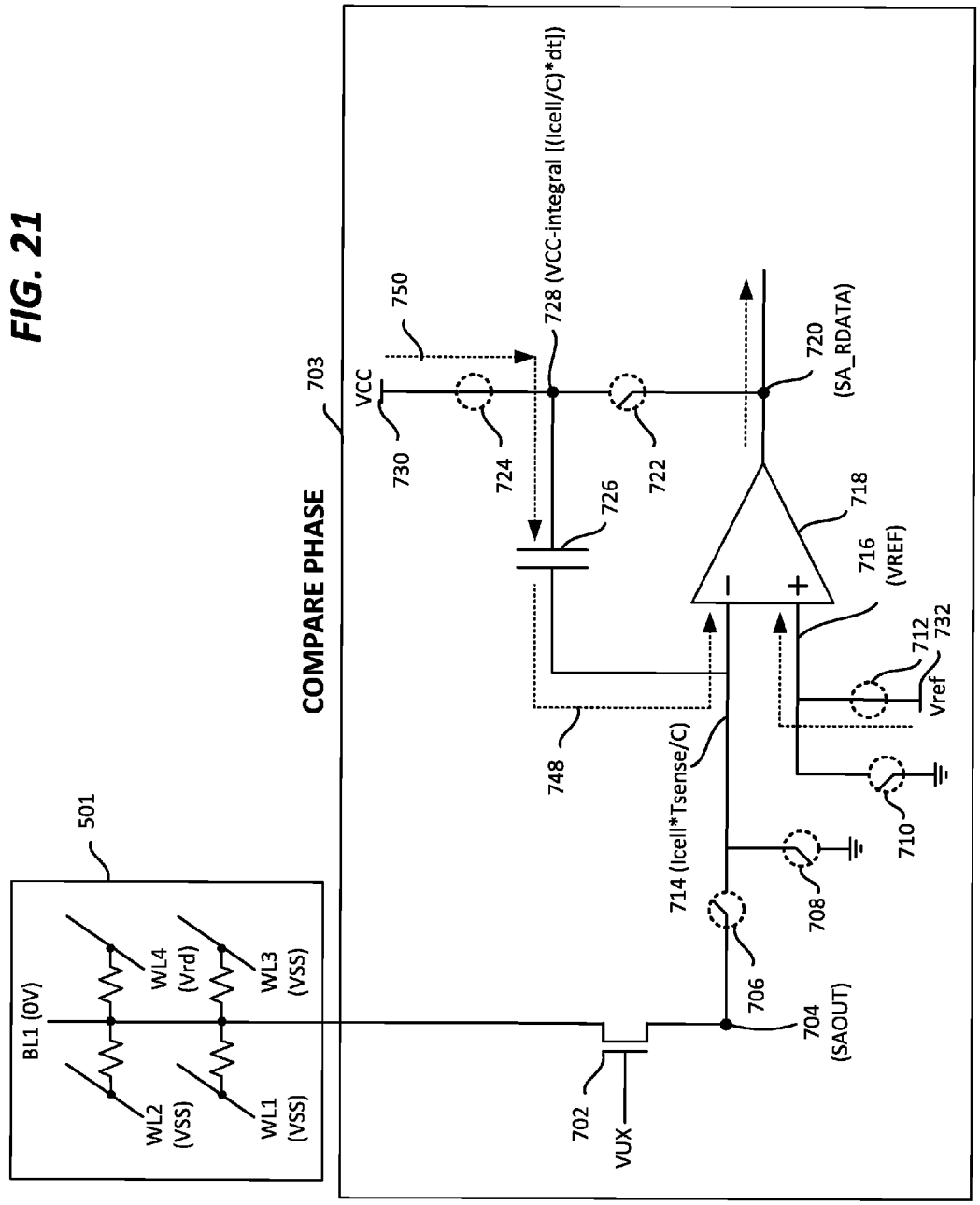
FIG. 21 is a circuit diagram depicting the sense amplifier of FIGS. 19 and 20 during a compare phase for a read operation in accordance with one embodiment.

FIG. 21 depicts the sense amplifier circuit 703 during a sense phase that follows the preset phase in one embodiment. Switches 706, 710, and 722 are opened. Switch 708 remains open and switch 724 is closed. In this configuration, a reference voltage Vref is provided from the second voltage source 732 to the positive input node 716 of OTA 718. The value of Vref may be a single value in a binary memory cell implementation or may be set to different levels for multi-level sensing. The memory array 501 is isolated from SAOUT 704. The second plate of capacitor 726 is again connected to the first voltage source 730 so that it charges to VCC through a current 750. This results in a current 748 passing from the first plate of capacitor 726 to the negative input node 714 of OTA 718. Current 748 results in a voltage at input node based on the cell current. The voltage at the input node is given by Equation 5:

$$V = Icell * \frac{Tsense}{C} \qquad \text{Equation 5}$$

The voltage is equal to the product of the cell current Icell and the quotient of the sense time Tsense and capacitance C of capacitor 726. Opamp 718 is then used to compare the resulting voltage at input node 714 with the reference voltage Vref at input node 716. If the corresponding memory cell is on (conductive during sensing), the voltage at input node 714 will be lower than the reference voltage Vref. This results in OTA 718 generating an output SA_RDATA equal to logic 'High'. If the memory cell is off (not conductive during sensing), the voltage at input node 714 will be higher than the reference voltage Vref. This results in OTA 718 generating an output SA_RDATA equal to logic 'Low.'

Thus, there is described a non-volatile storage system that includes a sense amplifier output connectable to a bit line, a first capacitor including a first plate coupled to the sense amplifier output and including a second plate, a second capacitor including a first plate coupled to the sense amplifier output and a second plate selectively coupled to a voltage source, and a first transistor including a gate coupled to the second terminal of the first capacitor. The first transistor includes a first terminal and a second terminal where the second terminal is coupled to ground. The system includes a second transistor including a gate coupled to the second terminal of the first capacitor. The second transistor includes a first terminal and a second terminal. The first terminal is coupled to a current source and is selectively coupled to the second plate of the first capacitor and the second plate of the second capacitor. The second terminal of the second transistor is coupled to the first terminal of the first transistor.

A method of sensing in non-volatile memory is described that includes coupling a sense amplifier output to a bit line and ground during a preset phase, and charging a first capacitor to a first voltage based on a threshold voltage of a first transistor during the preset phase. The first capacitor includes a first terminal coupled to the sense amplifier output and a second terminal coupled to a gate of the first transistor. The method includes charging a second capacitor to a second voltage during the preset phase. The second capacitor is coupled to a sense node. The method includes coupling the sense amplifier output to the bit line and disconnecting the sense amplifier output from ground during a sense phase, integrating a bit line current using the second capacitor during the sense phase, and providing a voltage at the sense node based on integrating the bit line current with the second capacitor.

A method of operating non-volatile storage is described that includes coupling a sense amplifier output to a bit line, a ground terminal, a first terminal of a first capacitor, and a first terminal of a second capacitor during a preset phase, coupling a second terminal of the first capacitor to a current source, a gate of a first transistor, and a gate of a second transistor during the present phase, coupling a second terminal of the second capacitor to a voltage source and a sense node during the preset phase, disconnecting the second terminal of the first capacitor from the current source during a sense phase, disconnecting the second terminal of the second capacitor from the voltage source during the sense phase, providing a bit line current through the second capacitor, the second transistor, and the first transistor to ground during the sense phase, and providing a voltage at the sense node based on the bit line current during the sense phase.

A non-volatile storage system is described that includes a sense amplifier output connectable to a bit line, a first capacitor including a first plate coupled to the sense amplifier output and including a second plate, a second capacitor including a first plate coupled to the sense amplifier output and a second plate, and a first transistor including a gate coupled to the second terminal of the first capacitor. The first transistor includes a first terminal and a second terminal with the second terminal coupled to ground. The system includes a second transistor including a gate coupled to the second terminal of the first capacitor. The second transistor includes a first terminal and a second terminal. The system includes a current source coupled to the first terminal of the second transistor, a first switch coupled between the current source and the second terminal of the first capacitor, a second switch coupled to the second terminal of the second capacitor, a voltage source coupled to the second switch, and a third switch coupled between the second plate of the second capacitor and the first terminal of the second transistor.

A non-volatile storage system is described that includes a sense amplifier output connectable to a bit line, a first capacitor including a first plate selectively connectable to the sense amplifier output and a second plate selectively connectable to a voltage source, and an operational amplifier having a first input selectively connectable to the sense amplifier output and a second input selectively connectable to a ground terminal and a reference voltage. The operational amplifier includes an output that provides read data by comparing the reference voltage and a voltage based on a cell current.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage system, comprising:
   a sense amplifier output selectively coupled to a bit line;
   a first capacitor including a first plate coupled to the sense amplifier output and including a second plate;
   a second capacitor including a first plate coupled to the sense amplifier output and a second plate selectively coupled to a voltage source;
   a first transistor including a gate coupled to the second plate of the first capacitor, the first transistor includes a first terminal and a second terminal, the second terminal is coupled to ground; and
   a second transistor including a gate coupled to the second plate of the first capacitor, the second transistor includes a first terminal and a second terminal, the first terminal is coupled to a current source and is selectively coupled to the second plate of the first capacitor and the second plate of the second capacitor, the second terminal of the second transistor is coupled to the first terminal of the first transistor.

2. The non-volatile storage system of claim 1, wherein:
the second plate of the first capacitor is coupled to the current source during a preset phase;
the second plate of the second capacitor is coupled to the voltage source during the preset phase; and
the sense amplifier output is coupled to ground during the preset phase.

3. The non-volatile storage system of claim 2, wherein:
the second plate of the first capacitor is disconnected from the current source during a sense phase;
the second plate of the second capacitor is disconnected from the voltage source during the sense phase; and
the sense amplifier output is disconnected from ground during the sense phase.

4. The non-volatile storage system of claim 3, wherein:
the second plate of the first capacitor is precharged to a first voltage from the current source during the preset phase; and
the first voltage is based on a threshold of the first transistor.

5. The non-volatile storage system of claim 4, wherein:
the second plate of the second capacitor is precharged to a level of the voltage source during the preset phase.

6. The non-volatile storage system of claim 5, further comprising:
a sense node coupled to the second plate of the second capacitor, the sense node is precharged to the level of the voltage source during the preset phase;
the second capacitor integrates a selected bit line current during the sense phase; and
the sense node is discharged during the sense phase from the level of the voltage source based on an integrated selected bit line current.

7. The non-volatile storage system of claim 6, wherein:
the second plate of the first capacitor is held at the first voltage during the sense phase; and
the sense amplifier output is held at zero volts during the sense phase.

8. The non-volatile storage system of claim 1, further comprising:
a monolithic three-dimensional non-volatile memory array including the bit line.

9. A non-volatile storage system, comprising:
a sense amplifier output connectable to a bit line;
a first capacitor including a first plate coupled to the sense amplifier output and including a second plate;
a second capacitor including a first plate coupled to the sense amplifier output and a second plate;
a first transistor including a gate coupled to the second plate of the first capacitor, the first transistor includes a first terminal and a second terminal, the second terminal is coupled to ground;
a second transistor including a gate coupled to the second plate of the first capacitor, the second transistor includes a first terminal and a second terminal;
a current source coupled to the first terminal of the second transistor;
a first switch coupled between the current source and the second plate of the first capacitor;
a second switch coupled to the second plate of the second capacitor;
a voltage source coupled to the second switch; and
a third switch coupled between the second plate of the second capacitor and the first terminal of the second transistor.

10. The non-volatile storage system of claim 9, wherein:
the first switch couples the current source to the second plate of the first capacitor during a preset phase;
the second switch couples the voltage source to the second plate of the second capacitor during the preset phase; and
the third switch disconnects the second plate of the second capacitor from the first terminal of the second transistor during the present phase.

11. The non-volatile storage system of claim 10, wherein:
the first switch disconnects the current source from the second plate of the first capacitor during a sense phase;
the second switch disconnects the voltage source from the second plate of the second capacitor during the sense phase; and
the third switch couples the second plate of the second capacitor to the first terminal of the second transistor during the sense phase.

* * * * *